(12) United States Patent
Yamaguchi

(10) Patent No.: US 7,339,432 B2
(45) Date of Patent: Mar. 4, 2008

(54) VARIABLE GAIN AMPLIFIER AND DIFFERENTIAL AMPLIFIER

(75) Inventor: Kouichiro Yamaguchi, Tokyo (JP)

(73) Assignee: Icom Incorporated (JP)

( * ) Notice: Subject to any disclaimer, the term of this patent is extended or adjusted under 35 U.S.C. 154(b) by 63 days.

(21) Appl. No.: 11/479,272

(22) Filed: Jun. 30, 2006

(65) Prior Publication Data
US 2007/0159251 A1    Jul. 12, 2007

(30) Foreign Application Priority Data
Jun. 30, 2005    (JP)    ............................. 2005-192307

(51) Int. Cl.
*H03F 3/45*    (2006.01)
(52) U.S. Cl. .................................... 330/254; 330/252
(58) Field of Classification Search ................ 330/254, 330/252, 260, 261
See application file for complete search history.

(56) References Cited

U.S. PATENT DOCUMENTS

| | | | |
|---|---|---|---|
| 6,600,371 B2 | 7/2003 | Cali | |
| 6,892,062 B2* | 5/2005 | Lee et al. | 455/326 |
| 7,027,785 B2* | 4/2006 | Summers et al. | 455/126 |
| 7,031,687 B2* | 4/2006 | Kivekas et al. | 455/313 |

FOREIGN PATENT DOCUMENTS

| | | |
|---|---|---|
| JP | 2001-007667 | 1/2001 |
| JP | 2002-252532 | 9/2002 |

* cited by examiner

*Primary Examiner*—Henry Choe
(74) *Attorney, Agent, or Firm*—Baker & McKenzie LLP

(57) ABSTRACT

Variable gain amplifier includes signal amplifying transistor, and gain control transistors at output and non-output sides. Emitters or sources of gain control transistors at output and non-output sides are connected to collector or drain of signal amplifying transistor. Output load is connected between collector or drain of gain control transistor at output side and power source side. Load is connected between collector or drain of gain control transistor at non-output side and power source side. Output load and load have the same impedance. Negative feedback path is connected between output end of gain control transistor at output side and input end of signal amplifying transistor. Negative feedback path is also connected between output end of gain control transistor at non-output side and input end of signal amplifying transistor. Two negative feedback paths have the same circuit constant. A differential amplifier is formed of a pair of such variable gain amplifiers.

12 Claims, 33 Drawing Sheets

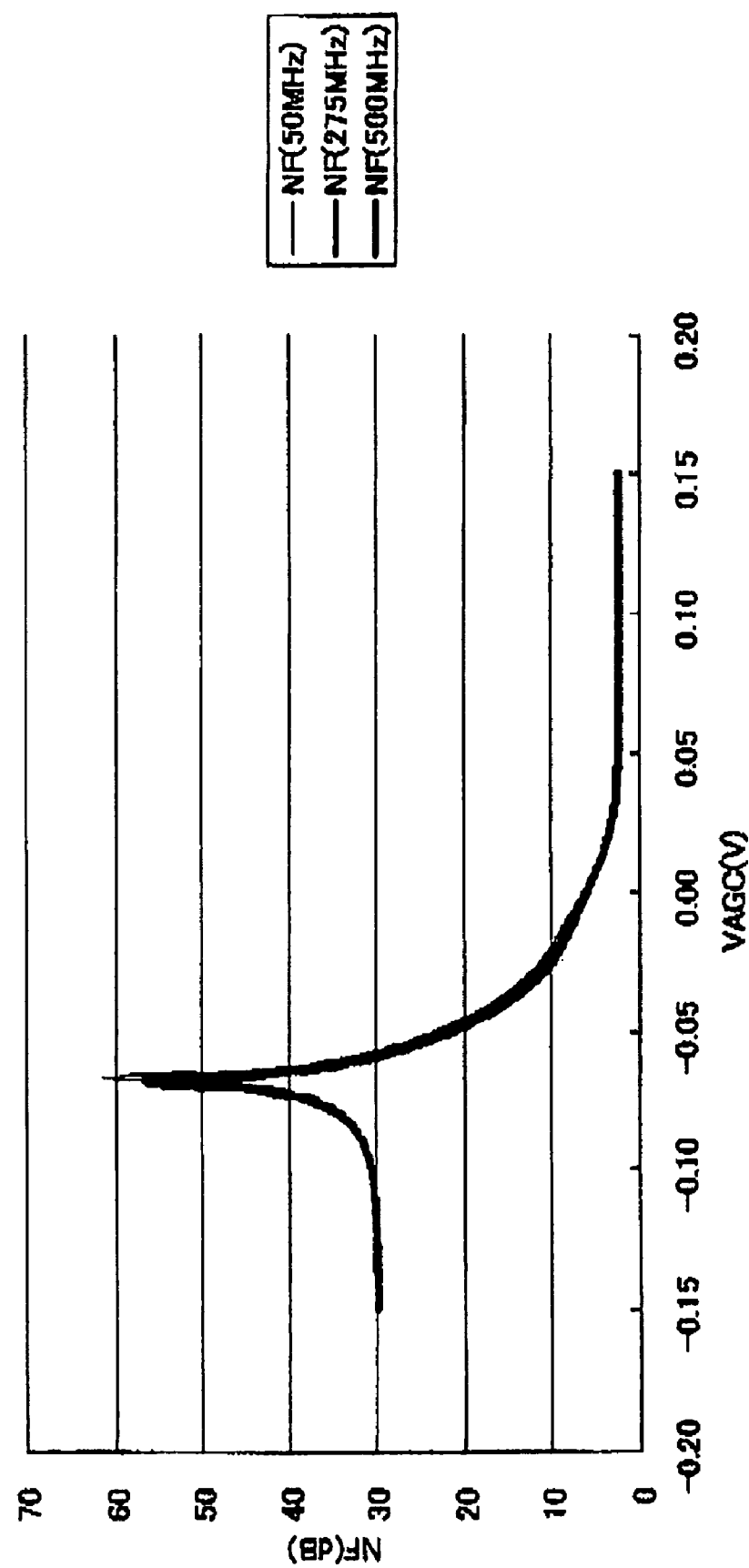

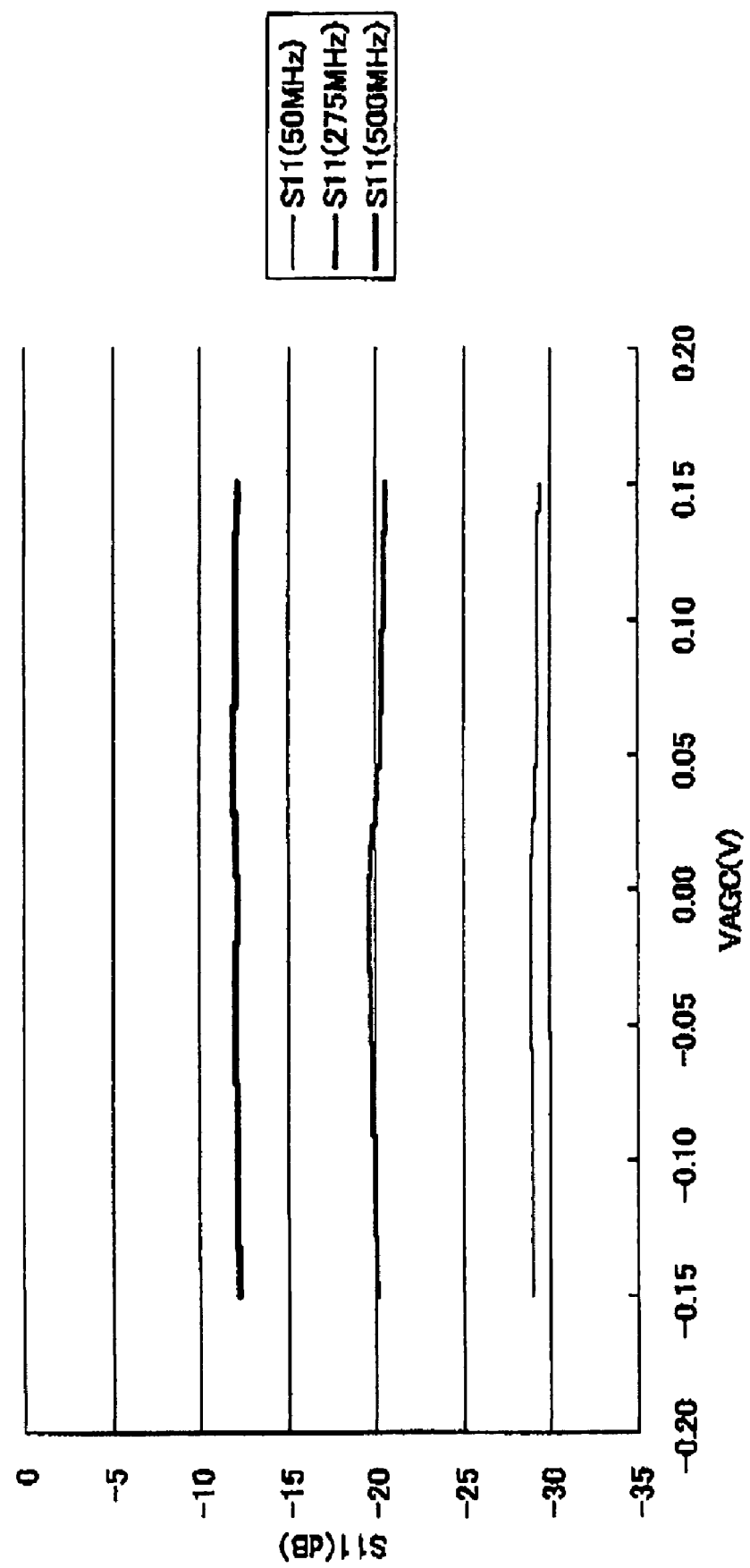

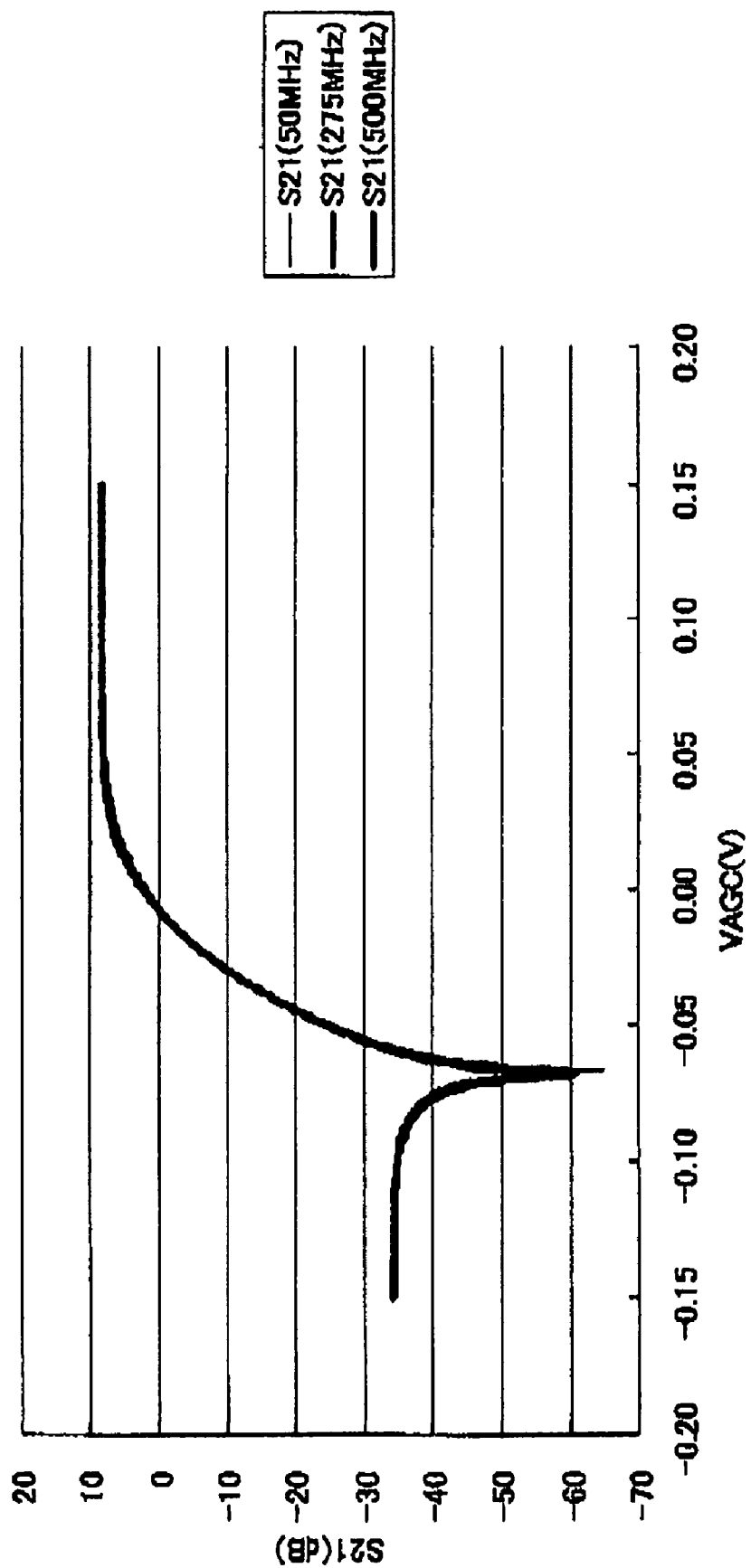

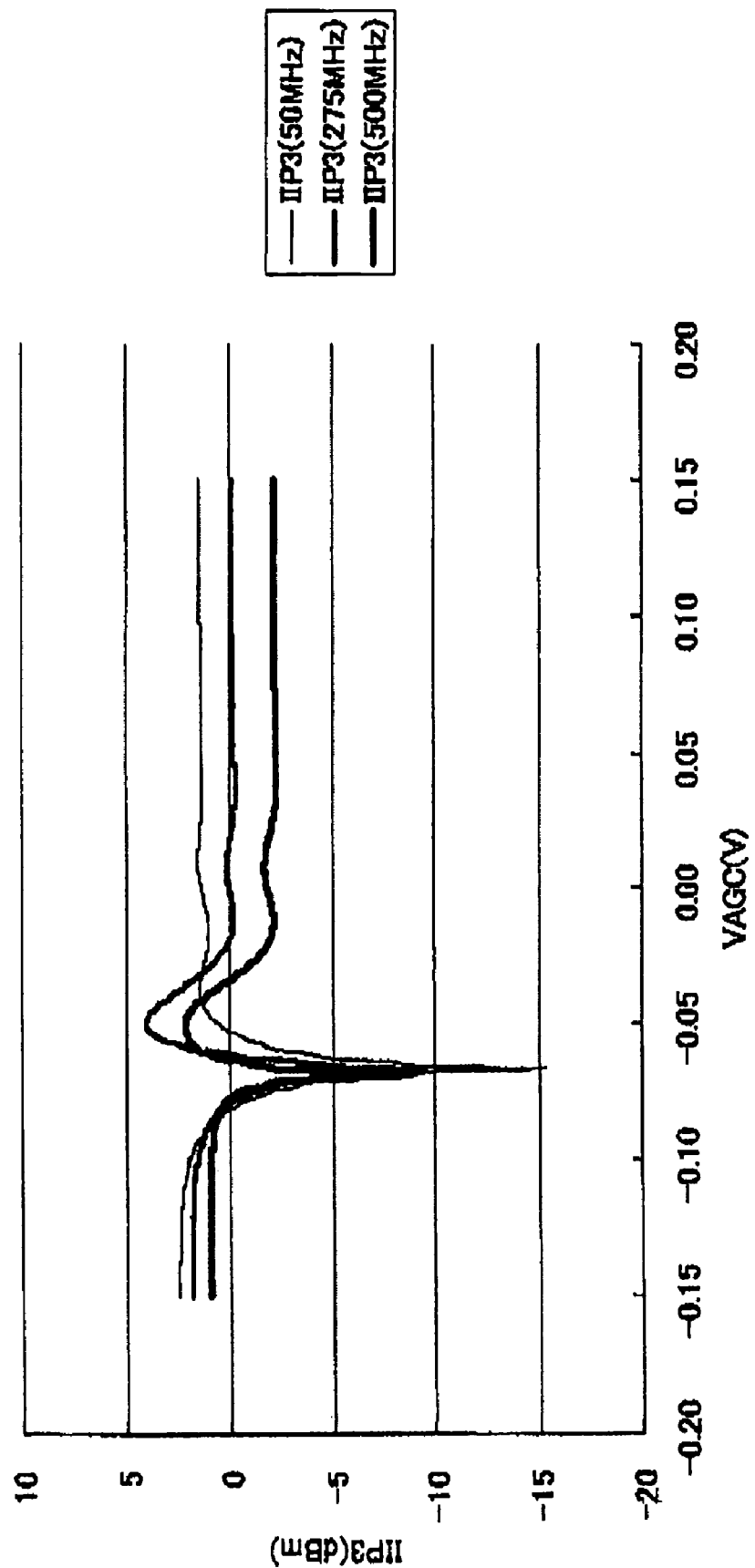

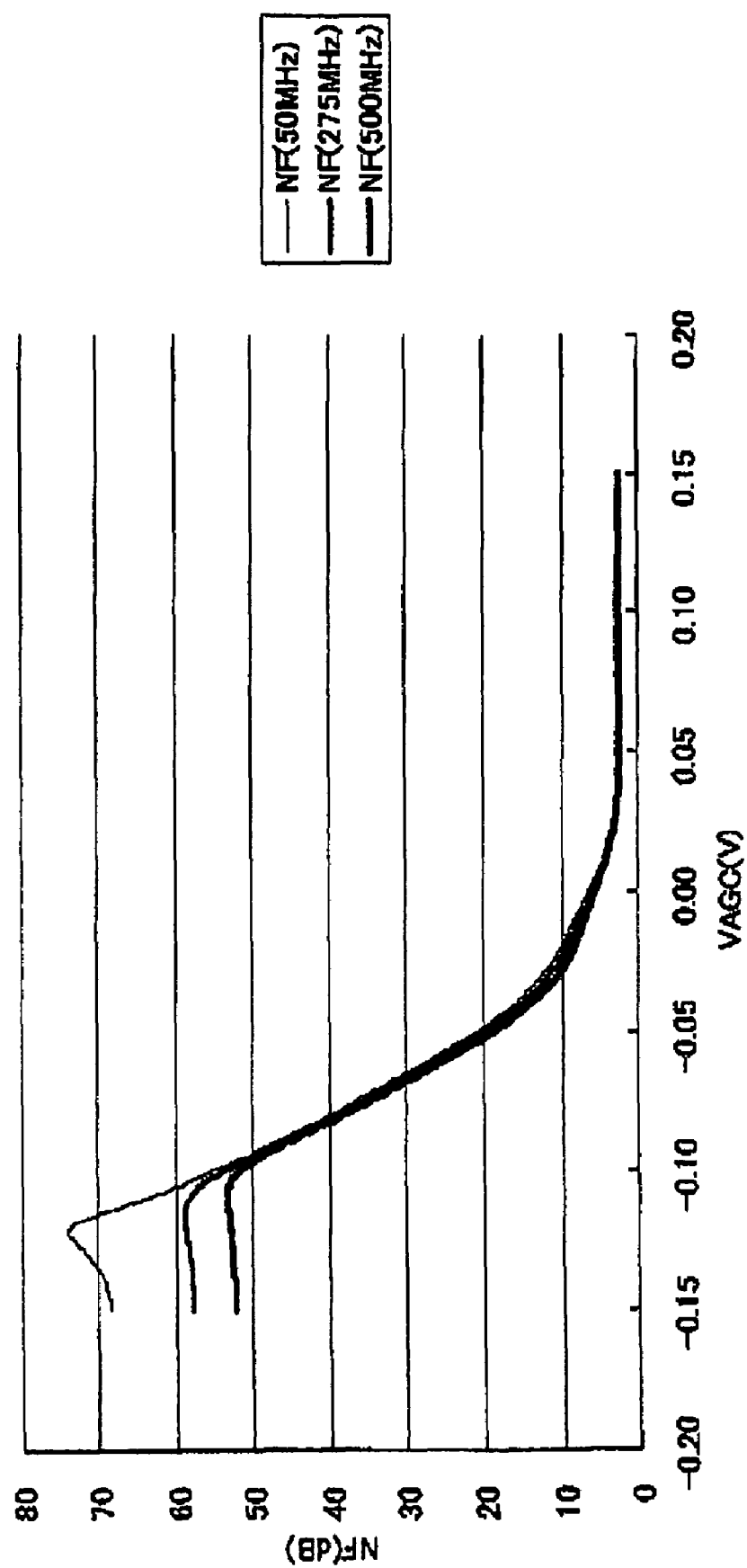

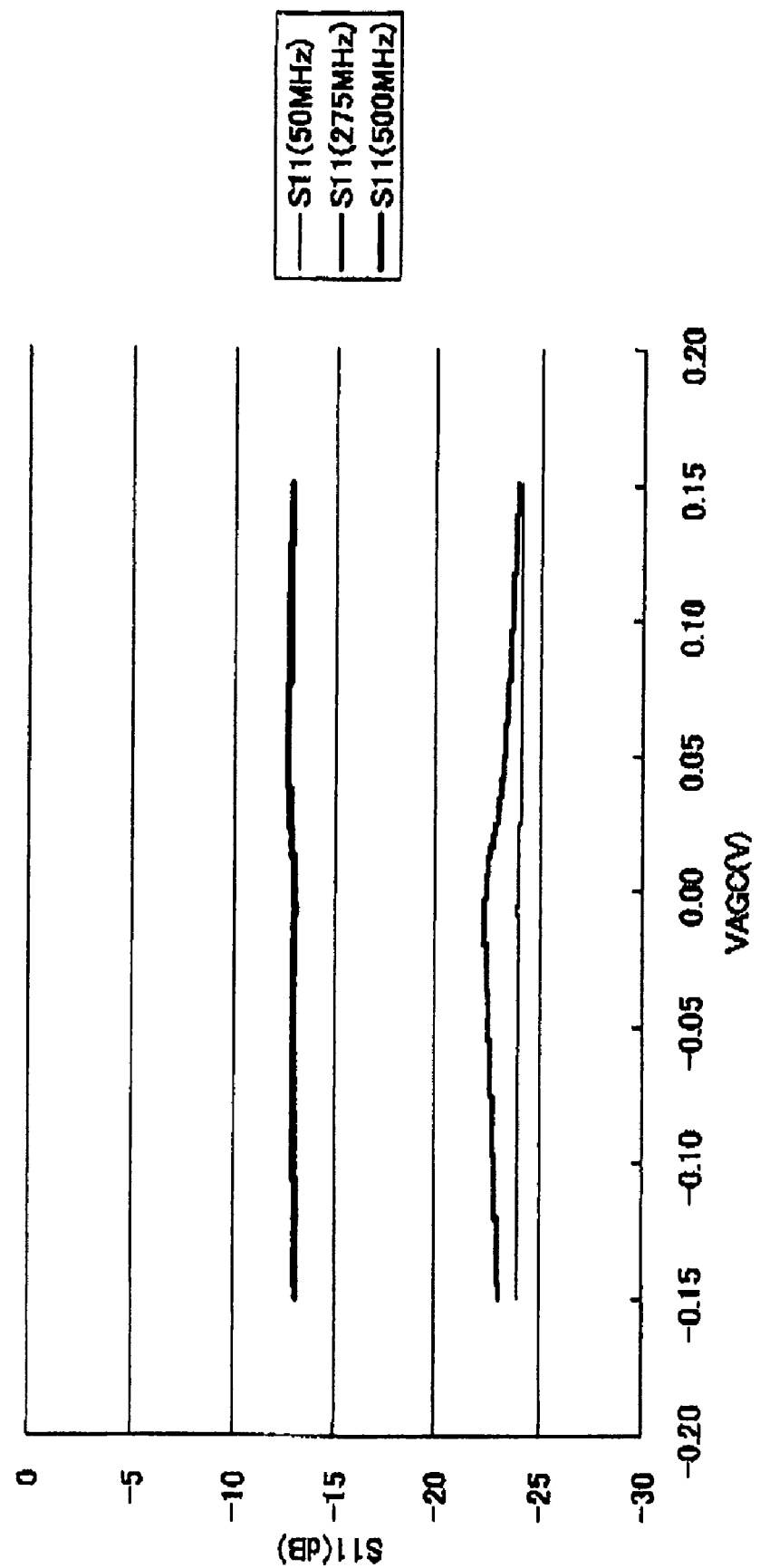

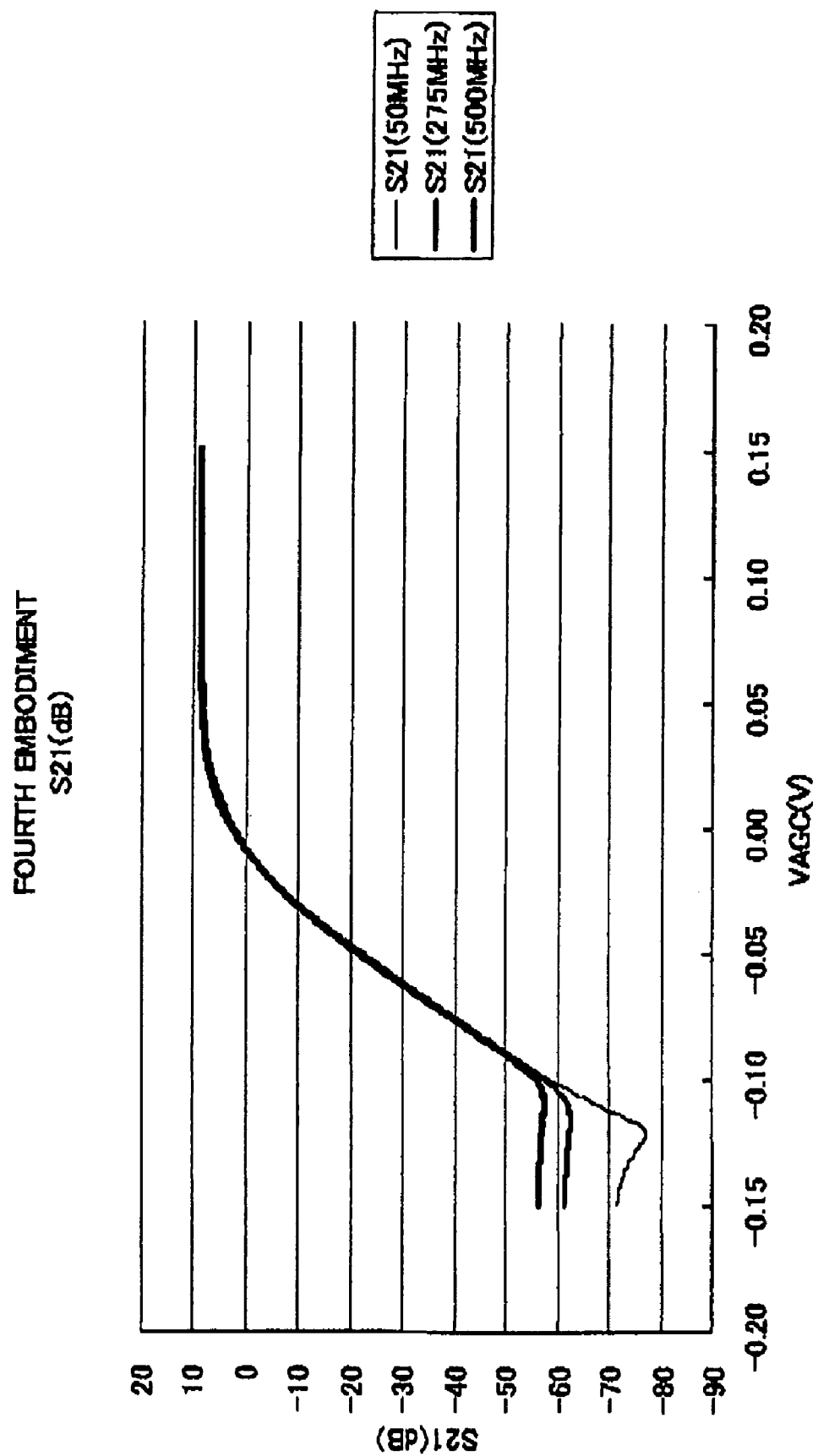

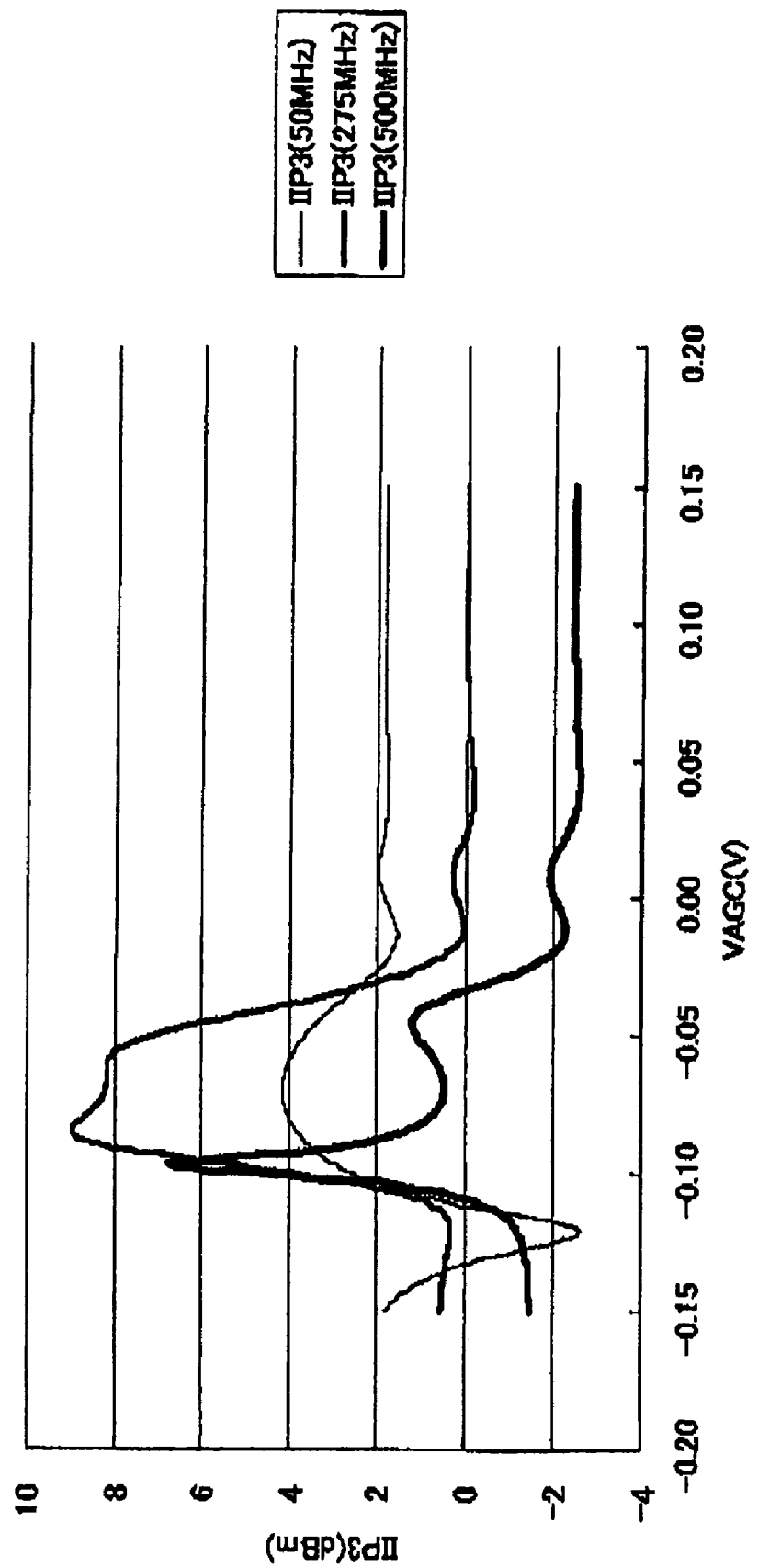

MODIFIED EMBODIMENT OF FOURTH EMBODIMENT
NF(dB)

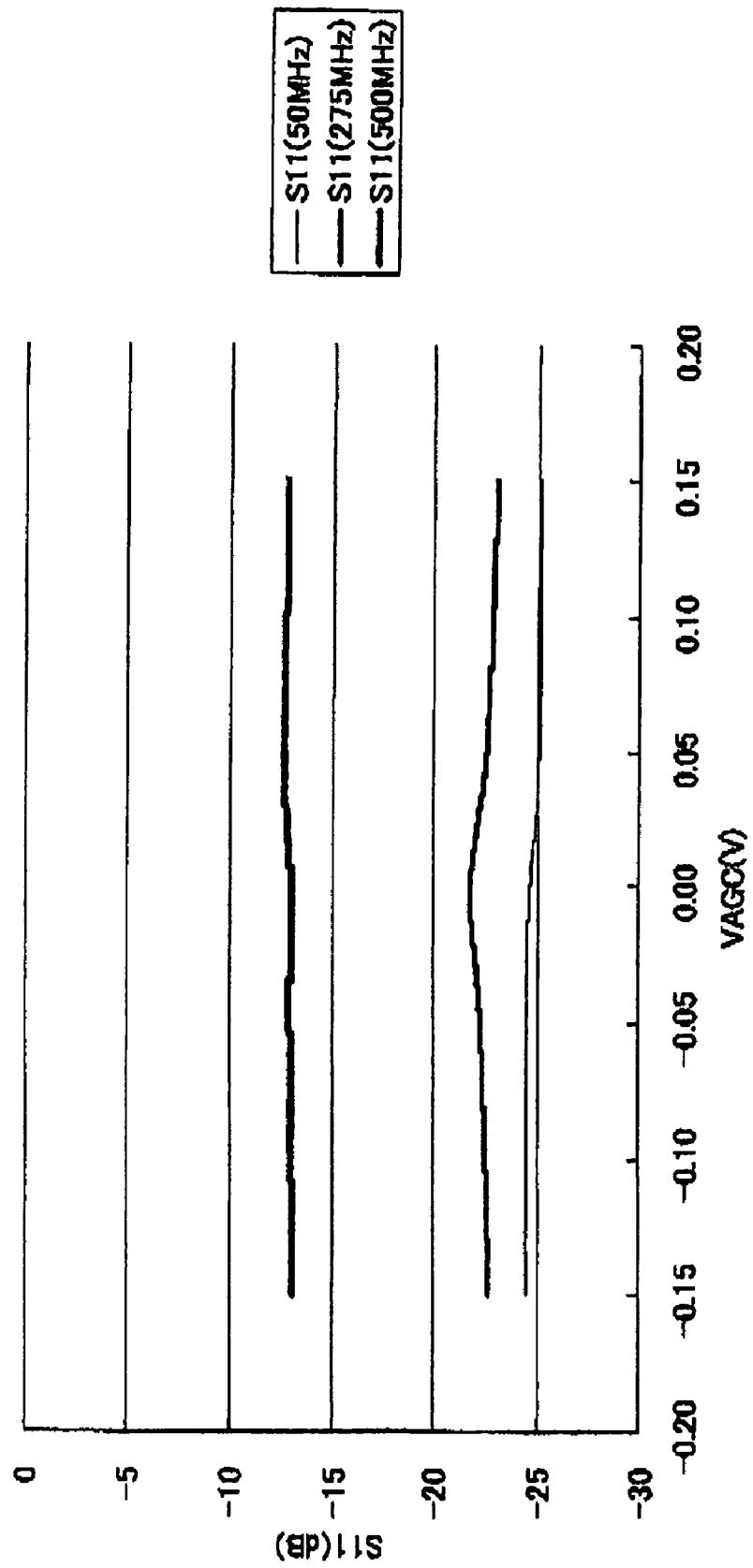

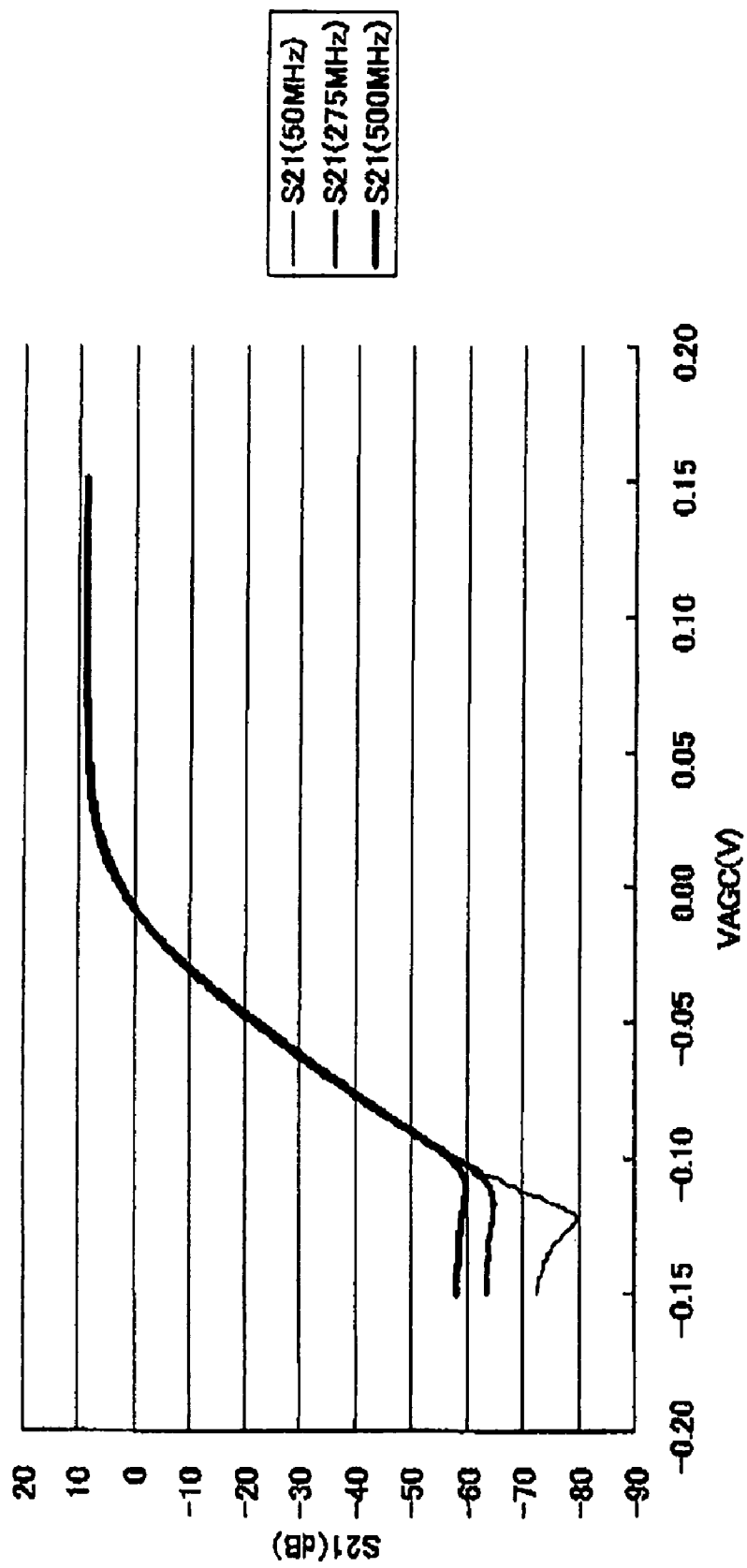

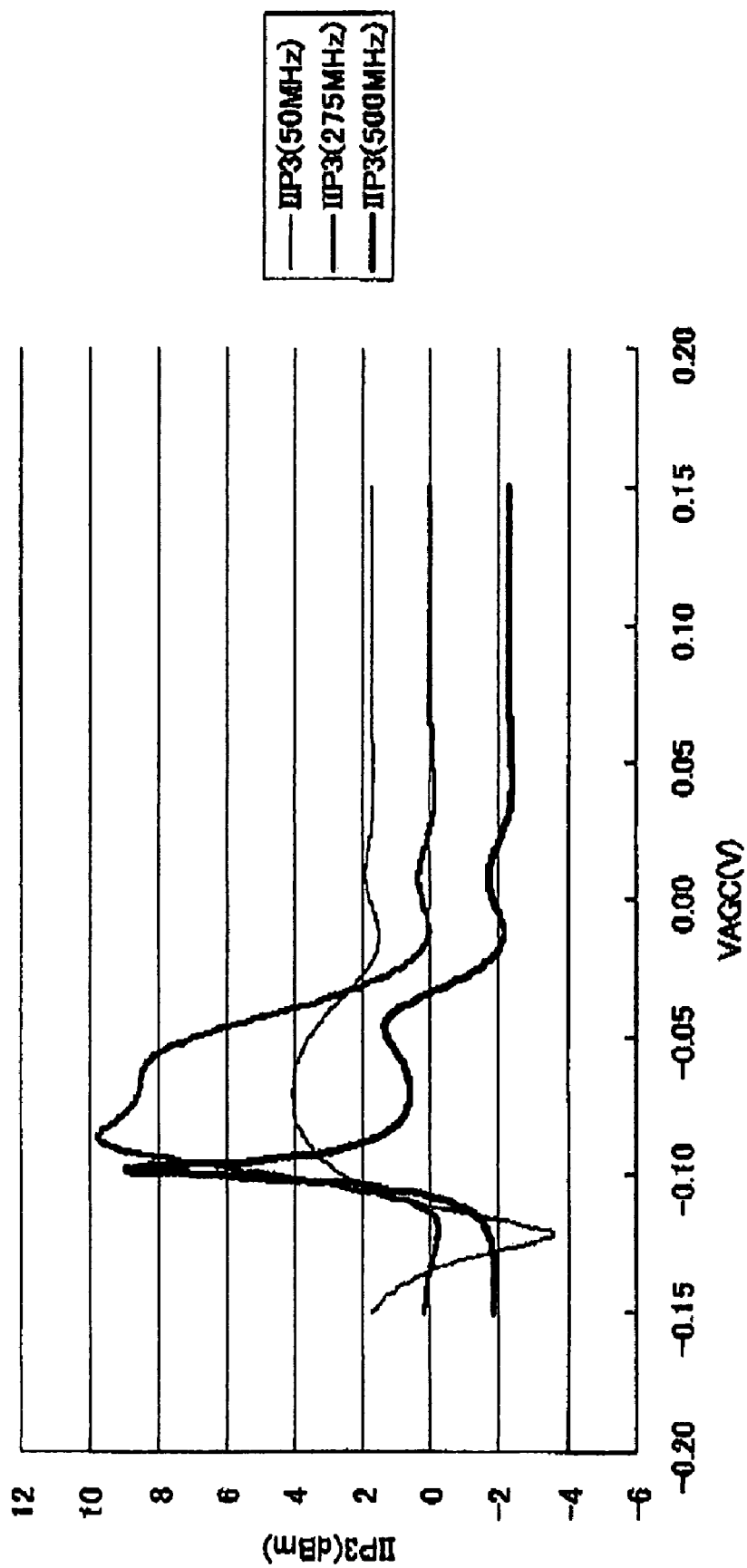

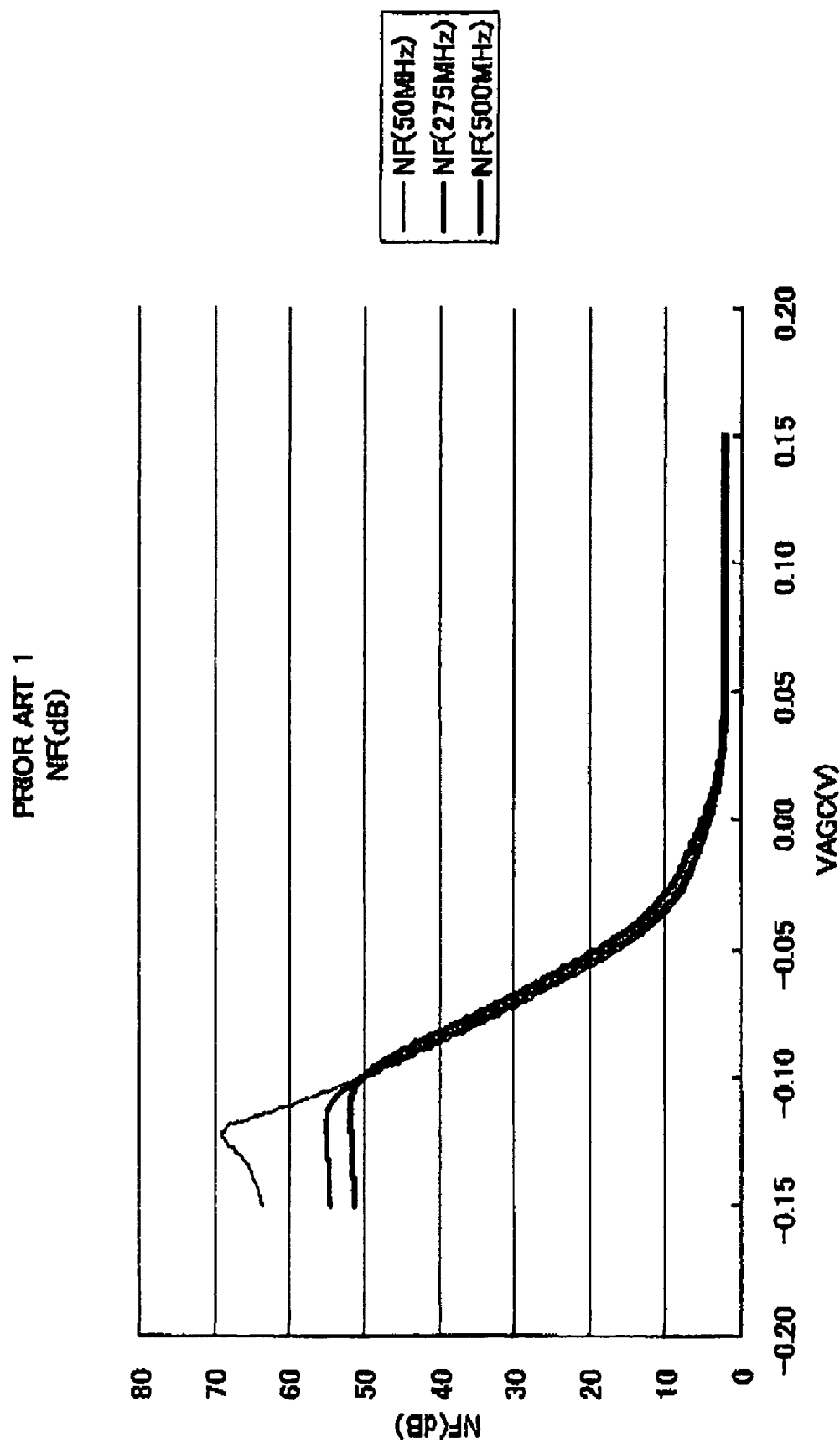

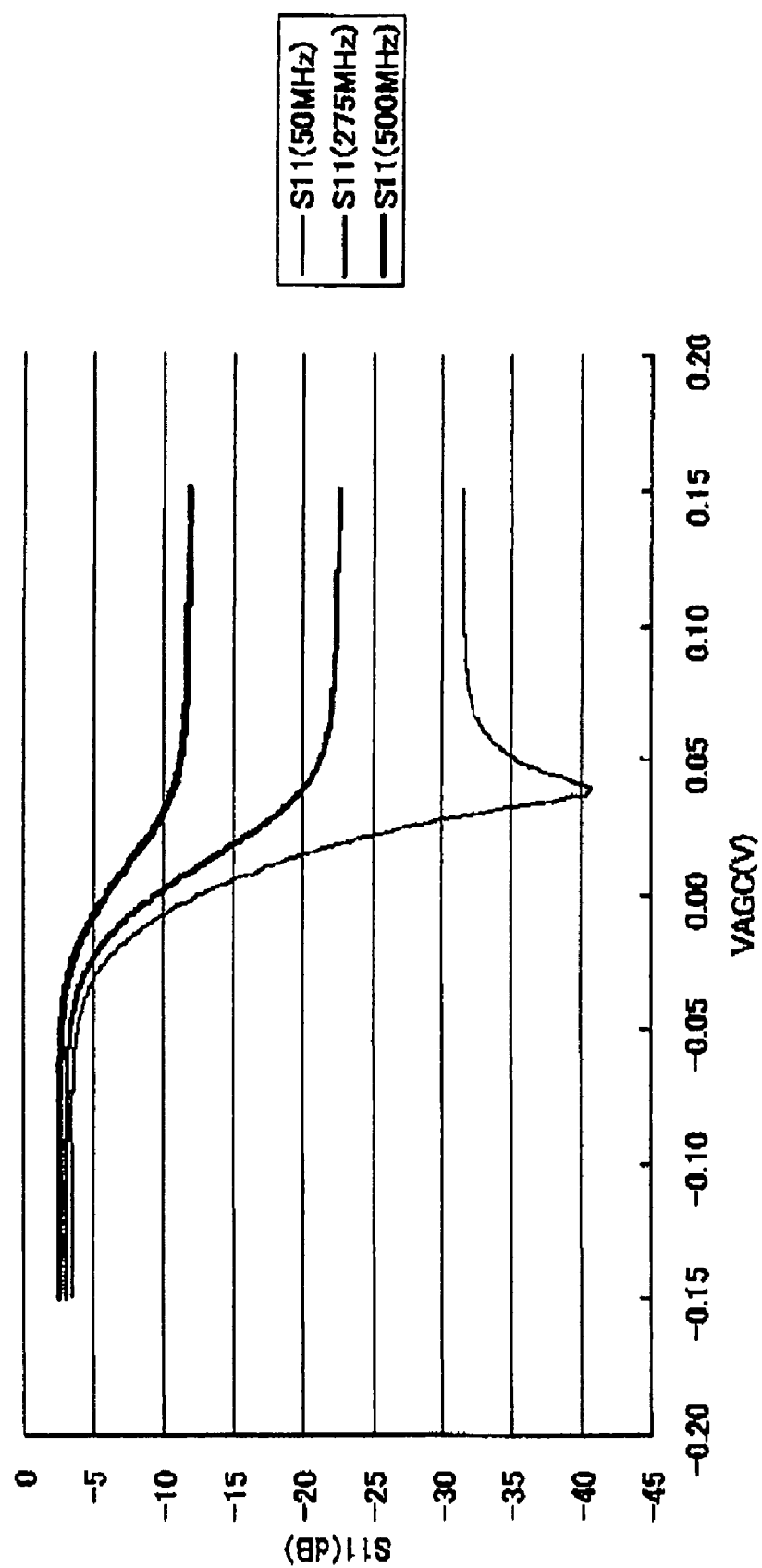

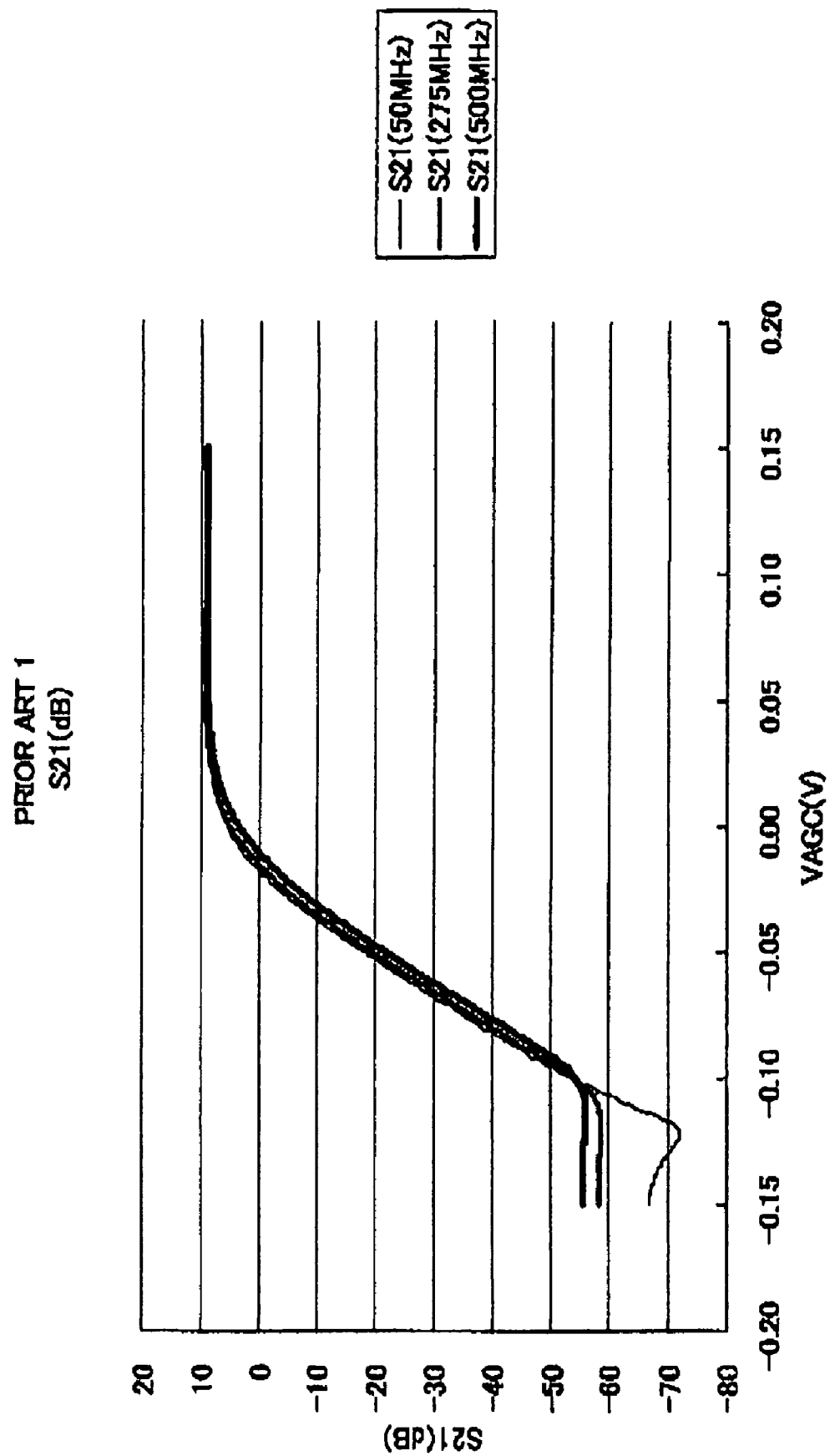

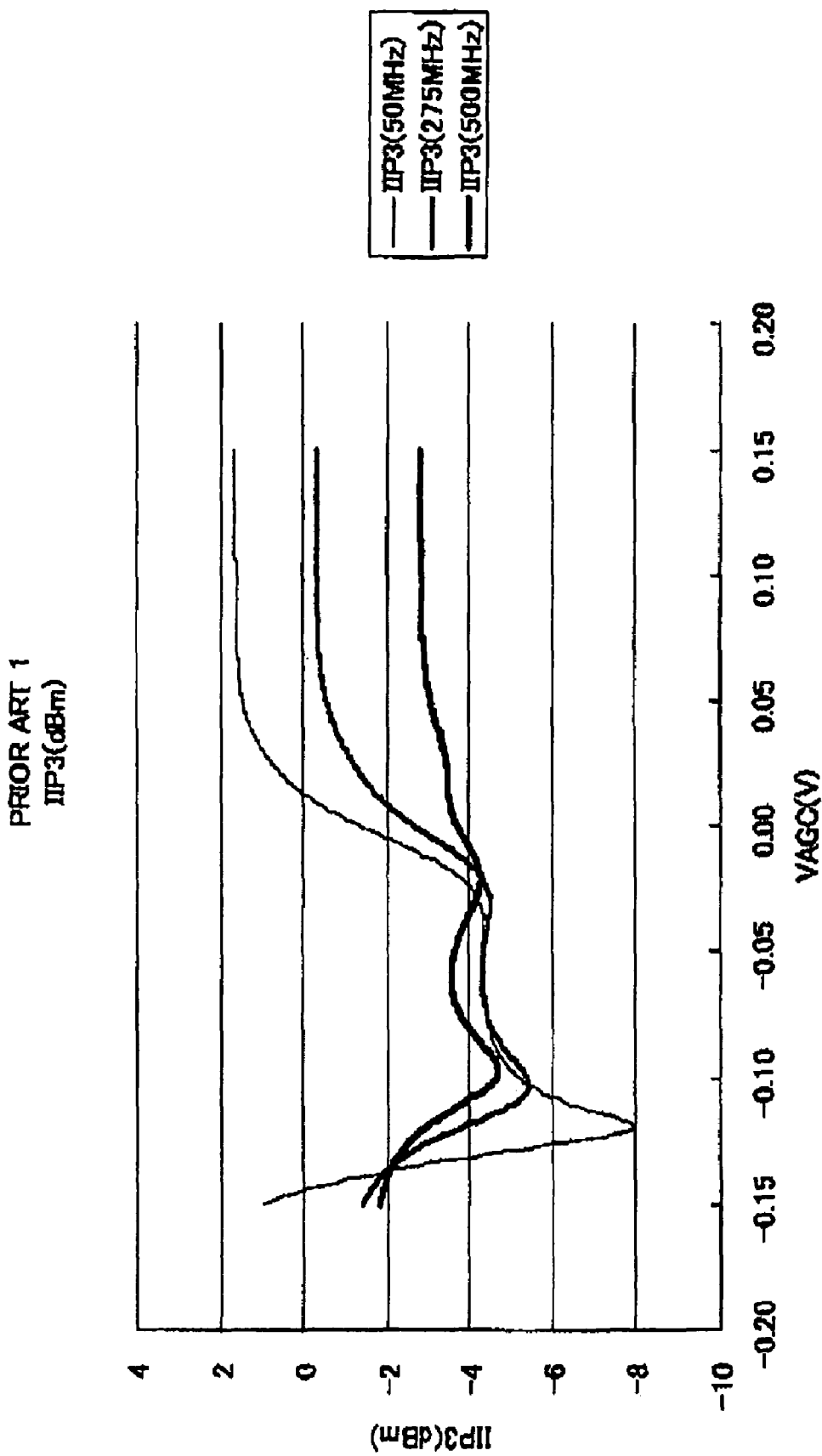

PRIOR ART 2

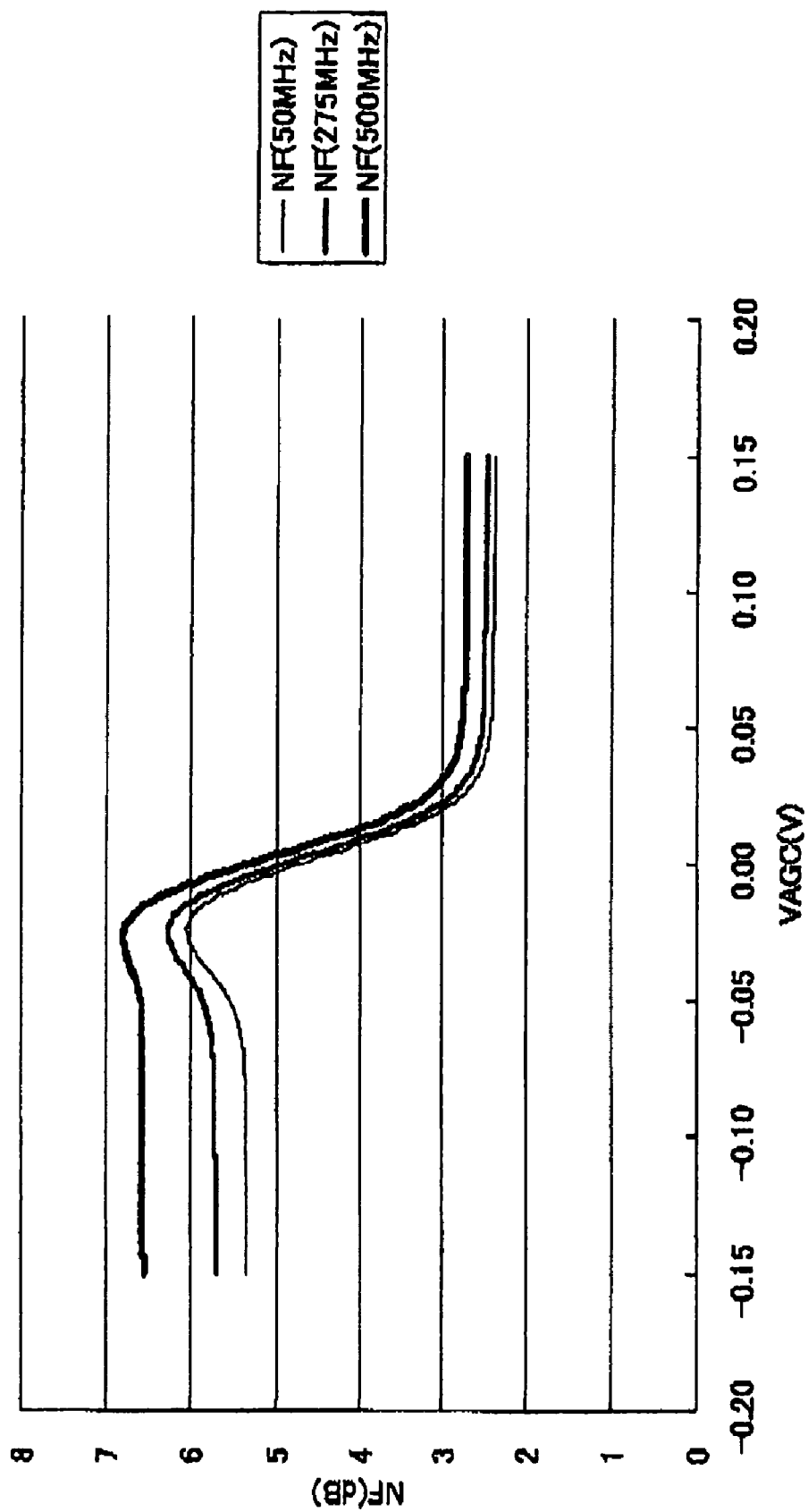

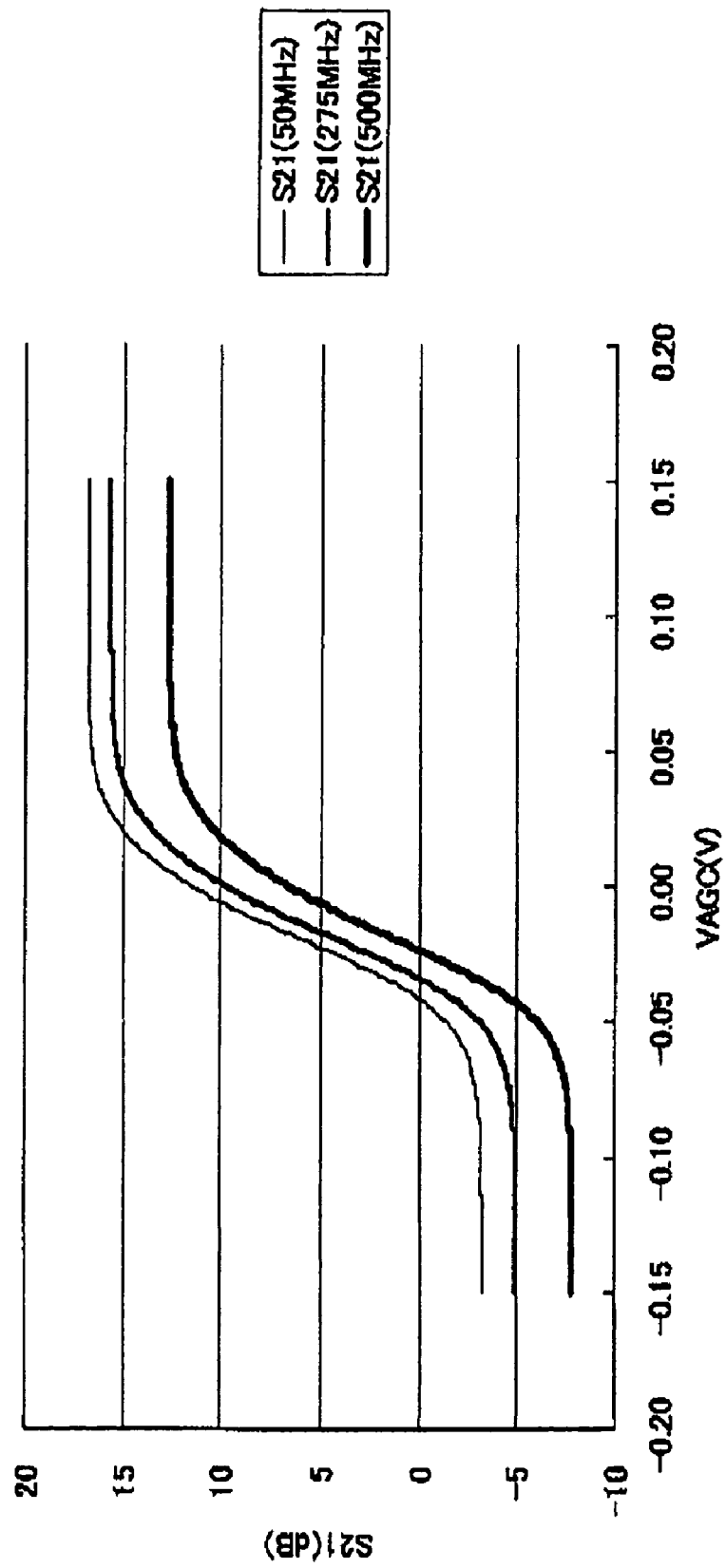

PRIOR ART 2

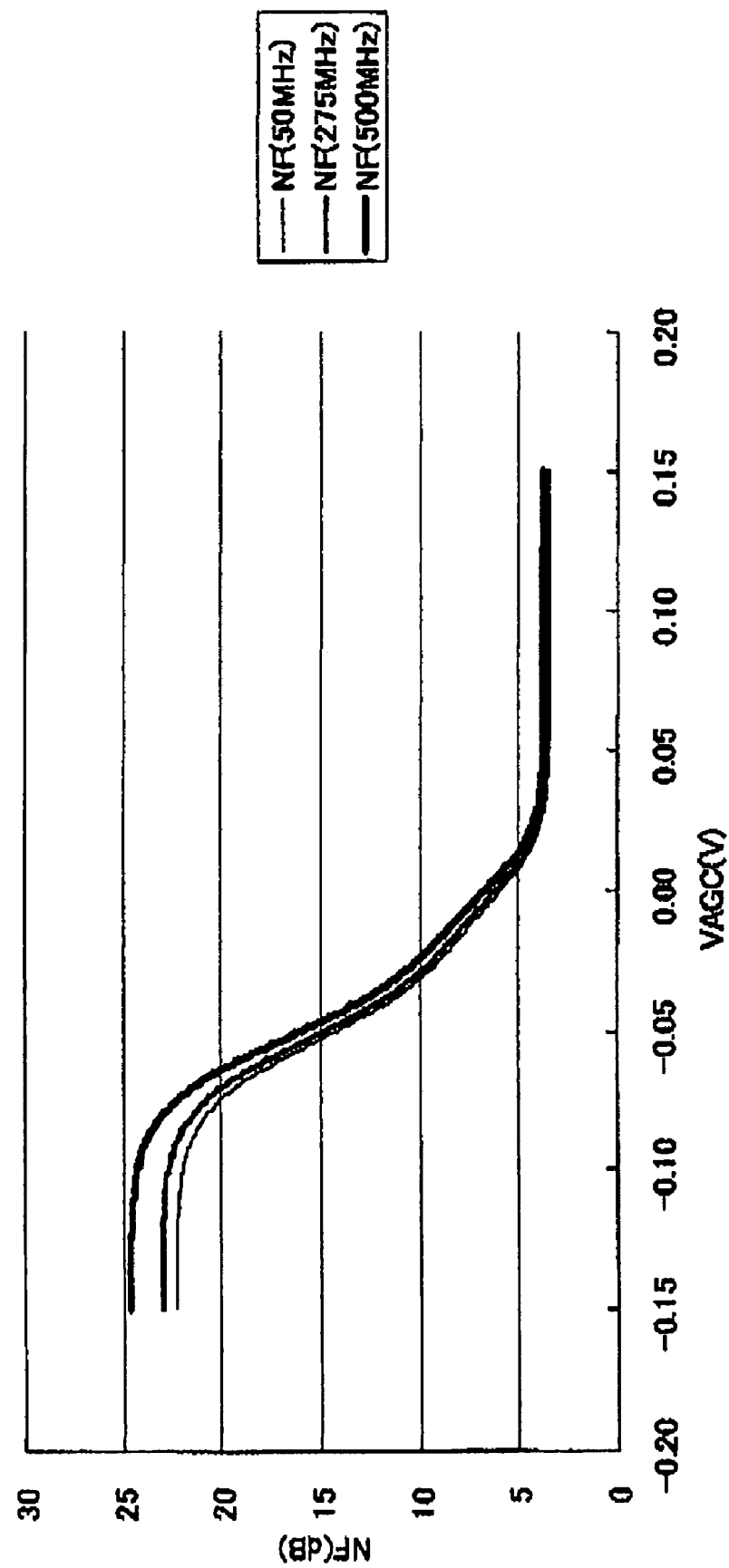

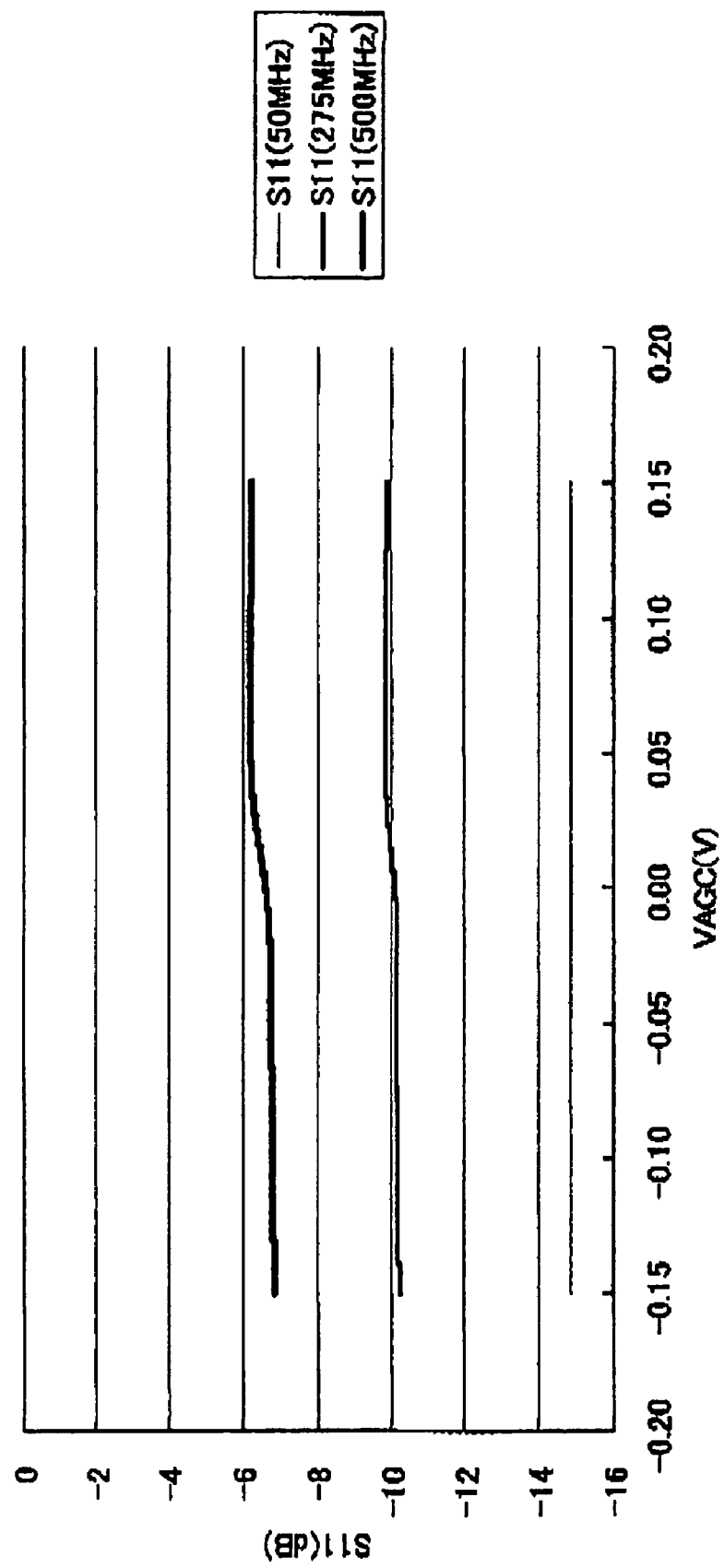

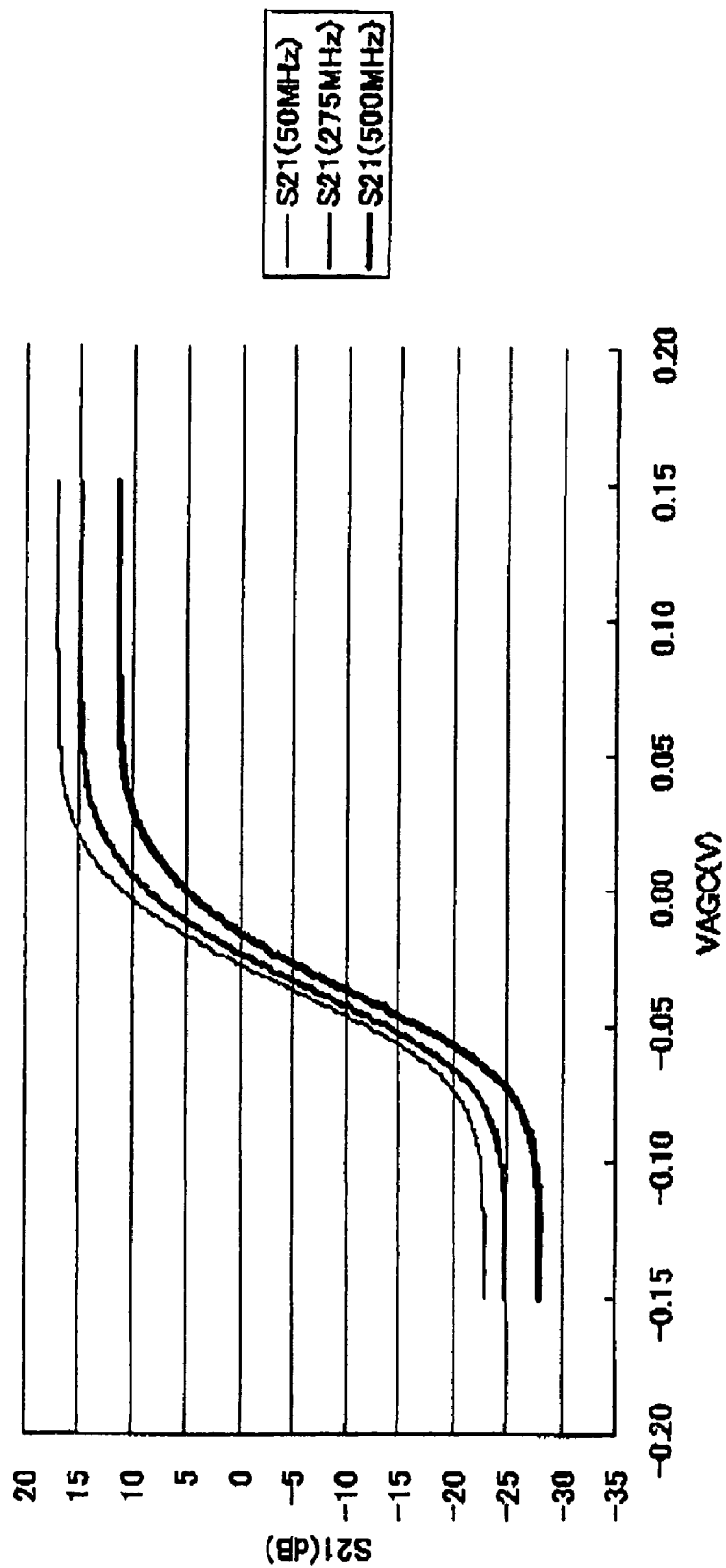

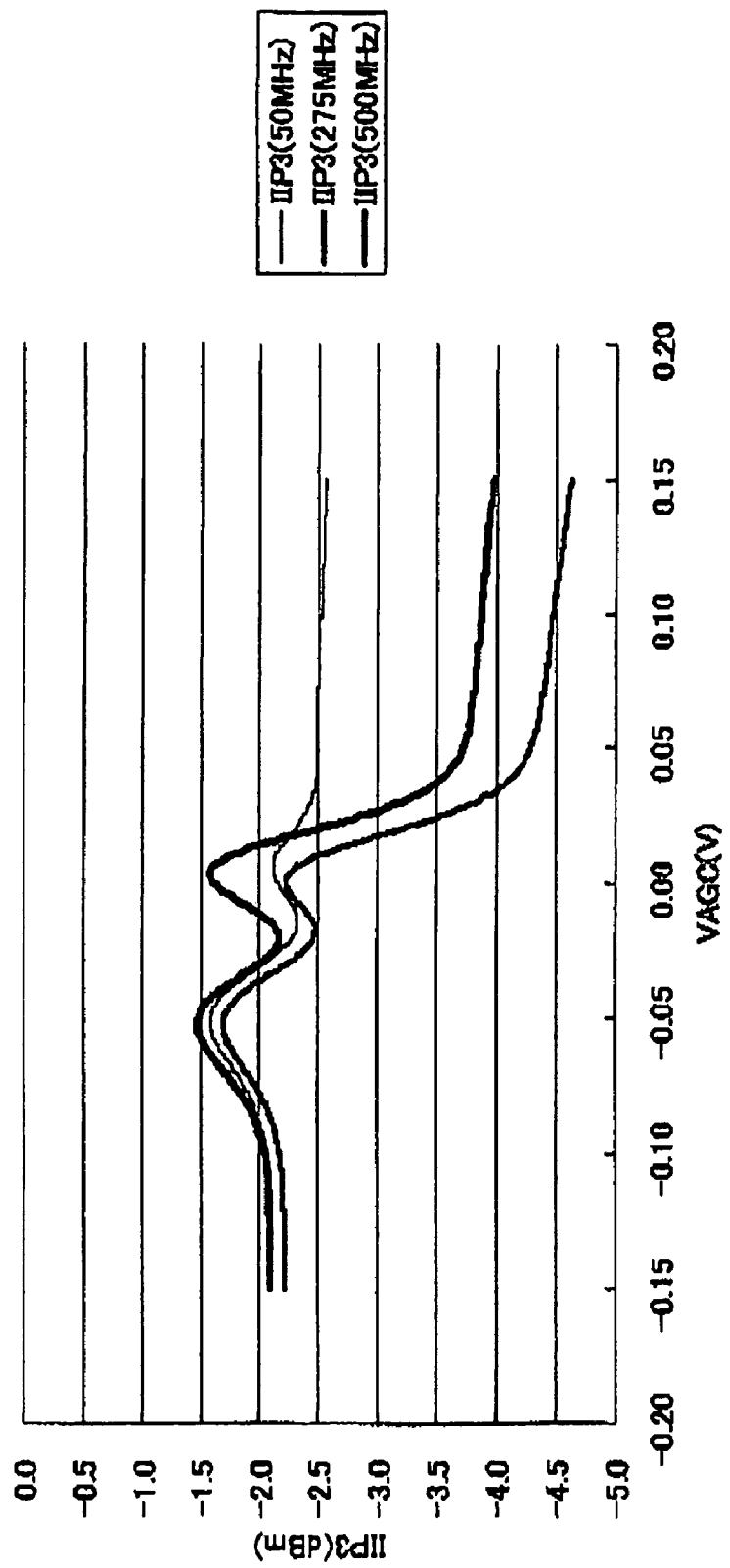

VARIABLE GAIN AMPLIFIER AND DIFFERENTIAL AMPLIFIER

BACKGROUND OF THE INVENTION

1. Field of the Invention

The present invention relates to a variable gain amplifier and a differential amplifier. Particularly, the present invention relates to a variable gain amplifier and a differential amplifier which comprise a signal amplifying transistor, and gain control transistors at output and non-output sides, whose current paths are respectively connected to the current path of the signal amplifying transistor.

2. Description of the Related Art (Prior Art 1)

As a structure of a single-ended variable gain amplifier, for example, the one shown in FIG. 9 has conventionally been known. The transistors included in the structure shown in FIG. 9 may be MOS transistors in some cases. In the structure shown in FIG. 9, as the amount of a current flowing into the collector of the upper output transistor 4 changes, the amount of negative feedback to the signal amplifying transistor 3 changes. Particularly, when the amplification degree is the smallest, there arises a problem that almost no negative feedback returns.

FIG. 10 is a circuit diagram showing a structure of a differential amplifier comprising two of the variable gain amplifier circuit of the Prior Art 1.

FIG. 11A to FIG. 11D are graphs showing the results of simulations conducted on the differential amplifier shown in FIG. 10. Specifically, FIG. 11A shows a graph plotting the changes of noise figure (hereinafter referred to as NF) with respect to the changes of gain control voltage, regarding the cases where the frequency of an input signal input to the differential amplifier shown in FIG. 10 is 50 MHz, 275 MHz, and 500 MHz respectively. FIG. 11B shows a graph plotting the changes of S parameter $S_{11}$ indicating an input reflection characteristic, with respect to the changes of gain control voltage, regarding the same cases as above. FIG. 11C shows a graph plotting the changes of S parameter $S_{21}$ indicating an input transmission characteristic, with respect to he changes of gain control voltage, regarding the same cases. FIG. 11D shows a graph plotting the changes of third order input intercept point (hereinafter referred to as IIP3) indicating an intermodulation distortion characteristic, with respect to the changes of gain control voltage, regarding the same cases. In FIG. 11A to FIG. 11D, the plot of the case where the frequency of the input signal is 500 MHz is indicated by the boldest solid line, the plot of the case where the frequency of the input signal is 275 MHz is indicated by the next boldest solid line, and the plot of the case where the frequency of the input signal is 50 MHz is indicated by the thin solid line, respectively.

In the graphs shown in FIG. 11A to FIG. 11D, the value $V_{AGC}$ on the X axis indicates, in volt unit, a ½ value of the voltage at an application point 9 in the structure of FIG. 10, with respect to the electric potential at an application point 10 as a reference. The bases of transistors 4a and 4b are each connected to the application point 9, and the bases of transistors 5a and 5b are each connected to the application point 10. Gain fluctuations arising in accordance with the changes of the value $V_{AGC}$ are expressed by the changes of the value of $S_{21}$ shown in FIG. 11C. The simulations on the value of IIP3 were conducted under a setting that two tone signals having frequencies distanced from each other by 20 kHz were input at an intensity of −50 dBm.

With reference to FIG. 11D, it is known that the results of the simulations under the settings that the frequency of the input signal is 275 MHz and 500 MHz are influenced by parasitic capacitance contained in the transistors. Accordingly, it can be considered that the simulation result of the case where the frequency of the input signal is 50 MHz is the closest to the result that can be achieved when ideal transistor elements are used.

According to these simulation results, a range of 60 dB or greater can be secured as the variable range of the gain of the differential amplifier shown in FIG. 10, in the case where the frequency of the input signal is 50 MHz. On the other hand, with reference to the plot (thin solid line) of the case where the frequency of the input signal is 50 MHz in FIG. 11D, it is known that when the gain is reduced, the amount of negative feedback is also reduced, which leads to the deterioration of IIP3. With reference to FIG. 11B, it is known that the values of $S_{11}$ are −30 dB or lower when the gain is sufficiently large, while the values deteriorate to about −3 dB as the gain is reduced.

Wide-band variable gain amplifiers are generally required to be able to achieve values of $S_{11}$, which are about −10 dB or lower over a wide band regardless of the gain, and to be able to cause no reduction of IIP3 even when the gain is reduced. According to the above-described simulation results, the differential amplifier according to the Prior Art 1 cannot satisfy these requirements.

(Prior Art 2)

As another structure conventionally known, for example, a structure shown in FIG. 12 is available. This structure corresponds to one that was published in the year 2003 as U.S. Pat. No. 6,600,371 B2.

The structure shown in FIG. 12 can constantly return a fixed amount of negative feedback even if the gain changes, thus can solve the problem of the above-described Prior Art 1. However, the structure of FIG. 12 has the following deficiencies.

(1) In the structure shown in FIG. 12, the gain variable range, i.e., the ratio of the maximum gain and the minimum gain is determined by the ratio of resistance values of resistors AP and BP, and the ratio of resistance values of resistors AM and BM. AP(BP) and AM(BM) have the same resistance in a balanced structure such as shown in FIG. 12. Hence, in the structure of FIG. 12, it is required to set the ratios of resistance values to 100:1 in order to obtain a gain variable range of, for example, 40 dB. However, in a case where the structure of FIG. 12 is realized by an integrated circuit, it is necessary to secure vast areas to be occupied by the resistors on the die to achieve ratios of resistance values of 100:1 exactly, when the same kind of sheet resistor is used for AP and BP. Accordingly, it is necessary to enlarge the area of the die only for obtaining a gain variable range of merely 40 dB.

(2) The larger the gain variable range desired to be secured is, the smaller the value of the resistor BP or BM needs to be made. Particularly, in a case where the signal to be amplified is a signal having a high frequency, AP+BP (which is equal to AM+BM for symmetry) cannot become larger than several hundreds ohms at most practically, to prevent the Miller effect. In turn, this means the resistance value of BP and BM needs to be less than several ohms, to secure 40 dB gain variable range at high frequency with the structure of FIG. 12. The amount of negative feedback which can be obtained from such a small feedback load resistance is substantially restricted, and in a typical case where the output impedance of the source of input signal is about 50Ω, it becomes harder to simultaneously achieve satisfactory input reflection characteristic, noise FIG. characteristic, and intermodulation distortion characteristic thereby. For above reasons, practically achievable gain range for the structure of the FIG. 12 is limited under 30 or 40 dB, in high frequency regions.

FIG. 14A to FIG. 14D are graphs showing the results of simulations conducted on a variable gain differential amplifier shown in FIG. 13. The Prior Art 2 is applied to the structure of FIG. 13, likewise to the structure of FIG. 12. The transistor model employed in these simulations is the same as the transistor model used in the simulations on the structure of the Prior Art 1 described above. The upper limit of the practical operating frequency of this transistor model is about 500 MHz. The LNA (Low Noise Amplifier) core current has also the same value as that in the simulations on the structure of the Prior Art 1.

FIG. 14A shows a graph plotting the changes of NF with respect to the changes of gain control voltage, regarding the cases where the frequency of an input signal input to the variable gain differential amplifier shown in FIG. 13 is 50 MHz, 275 MHz, and 500 MHz respectively. FIG. 14B shows a graph plotting the changes of $S_{11}$ with respect to the changes of gain control voltage, regarding the same cases. FIG. 14C shows a graph plotting the changes of $S_{21}$ with respect to the changes of gain control voltage, regarding the same cases. FIG. 14D shows a graph plotting the changes of IIP3 with respect to the changes of gain control voltage, regarding the same cases. In FIG. 14A to FIG. 14D, the plot of the case where the frequency of the input signal is 500 MHz is indicated by the boldest solid line, the plot of the case where the frequency is 275 MHz is indicated by the next boldest solid line, and the plot of the case where the frequency is 50 MHz is indicated by the thin solid line. In the simulations whose results are shown in FIG. 14A to FIG. 14D, the resistance value of the resistors r1 in FIG. 13 is set to 360Ω and the resistance value of the resistors r12 in FIG. 13 is set to 40Ω, and the gain variable range is 20 dB.

In the graphs shown in FIG. 14A to FIG. 14D, the value $V_{AGC}$ on the X axis indicates, in volt unit, the ½ value of the voltage at an application point 9 in the structure of FIG. 13, with respect to the electric potential of an application point 10 as a reference. Also in the structure of FIG. 13, the bases of transistors 4a and 4b are connected to the application point 9 respectively, and the bases of transistors 5a and 5b are connected to the application point 10 respectively. The gain fluctuations arising in accordance with the changes of the value $V_{AGC}$ are expressed by the changes of the value $S_{21}$, shown in FIG. 14C. Also in the Prior Art 2, the simulations on the value IIP3 were conducted under a situation where two tone signals having frequencies which were distanced from each other by 20 kHz were input at an intensity of −50 dBm.

With reference to FIG. 14A to FIG. 14D, it is known that the results of the simulations under the settings that the frequency of the input signal is 275 MHz and 500 MHz are influenced by parasitic capacitance contained in the transistors. Accordingly, it can be considered that the simulation result of the case where the frequency of the input signal is 50 MHz is the closest to the result that can be achieved when ideal transistor elements are used.

With reference to the thin line in FIG. 14B and FIG. 14D, that is, with reference to the plot of the case where the frequency of the input signal is 50 MHz, it is known that since the amount of negative feedback is unchanged even when the gain is reduced, the values of IIP3 and $S_{11}$ are nearly constant. It is further known that almost satisfactory performances are obtained for NF, $S_{11}$, and IIP3, under the condition that the frequency of the input signal is 50 MHz.

On the other hand, with reference to FIG. 14D, it is known that the value of IIP3 when the gain is maximum deteriorates by about 4 dB from the value thereof when the gain is minimum, under the condition that the frequency of the input signal is 500 MHz. In order to improve the performance of IIP3 without replacing the transistors, it is necessary to make the resistance values of the resistors r1 and r12 small, mitigating the Miller effect thereby. However, in this case, there also arises a necessity of making the resistance values of resistors rfb, which constitute the negative feedback path, small, too. If the resistance values of the resistors rfb are made small, NF will deteriorate. This easiness of deterioration of the intermodulation distortion characteristic in the high frequency range is the first drawback of the structure of the Prior Art 2.

FIG. 15A to FIG. 15D are graphs showing the results of simulations conducted on the structure of FIG. 13, under the same conditions as those of FIG. 14A to FIG. 14D, except that the resistance value of the resistors r1 is set to 396Ω, the resistance value of the resistors r12 is set to 4Ω, and the gain variable range is set to 40 dB. Note that in these simulations, the resistance value of the resistors rfb in the negative feedback path is set to a small value, so that the values of $S_{11}$ will be about the same values (about −16 dB) of $S_{11}$ of the case where the gain variable range is 20 dB and the frequency of the input signal is 50 MHz.

Comparing the values of NF and IIP3 at the maximum gain, obtained from these simulations with the simulation results of the case where the gain variable range is 20 dB, NF deteriorates by 1 dB and IIP3 deteriorates by about 1 dBm. In order to improve the value of IIP3 to about the same value as that achieved in the case where the gain variable range is 20 dB, it is necessary to further make the resistance value of the resistors rfb small. However, this entails a further deterioration of NF. Therefore, it is difficult to increase the gain variable range to about 20 dB or greater without causing deterioration of NF and IIP3 in the structure of the Prior Art 2. This is the second drawback of the Prior Art 2.

(Other Prior Art)

Other than the above, techniques taught by Unexamined Japanese Patent Application KOKAI Publication No. 2002-252532 and Unexamined Japanese Patent Application KOKAI Publication No. 2001-7667 can be raised as the techniques for improving the variable gain amplifier circuit.

Unexamined Japanese Patent Application KOKAI Publication No. 2002-252532 discloses a method for a plurality of variable gain amplifier circuits which are connected in parallel and reduce the gain in accordance with an increase of a control voltage input from the outside, wherein the gain of the variable gain amplifier circuits is reduced when the control voltage for the variable gain amplifier circuits increases, in the order of the circuits having smaller emitter resistance values. With this method, it is considered that the noise figure characteristic and the intermodulation distortion characteristic can simultaneously be satisfied in the variable gain amplifier.

Unexamined Japanese Patent Application KOKAI Publication No. 2001-7667 discloses a method for reducing noise of a high frequency wave, by connecting a load resistor between a power source and the collector of a non-output side transistor among gain controlling transistors, and connecting a capacitor between that collector and the ground.

SUMMARY OF THE INVENTION

The present invention was made in view of the problems of the above-described prior arts, and an object of the present invention is to provide a variable gain amplifier which realizes an almost fixed amount of negative feedback constantly even when the gain is changed, and can achieve amplification degree, distortion characteristic, and input reflection characteristic which are stable over a wide band.

To achieve the above object, a variable gain amplifier according to a first aspect of the present invention comprises:

an amplifying element for signal amplification, having a first current path and a first control terminal;

an amplifying element for gain control at an output side, having a second current path connected to a load at an output side, and a second control terminal;

an amplifying element for gain control at a non-output side, having a third current path connected to a load at a non-output side, and a third control terminal; and first and second negative feedback paths, so that an electric current, which corresponds to an input signal input to the first control terminal and amplified by a gain determined by control signals input to the second and third control terminals, will flow to the load at the output side via the second current path, the amplifying element for signal amplification, the amplifying element for gain control at the output side, and the amplifying element for gain control at the non-output side are connected to one another such that a current flowing in the first current path will dividedly flow to the second and third current paths, the first negative feedback path connects the second current path to the first control terminal, in order to return a feedback signal following an amount of a current flowing in the load at the output side to the first control terminal, and the second negative feedback path connects the third current path to the first control terminal, in order to return a feedback signal following an amount of a current flowing in the load at the non-output side to the first control terminal.

A differential amplifier according to a second aspect of the present invention comprises first and second variable gain amplifiers, each of the first and second variable gain amplifiers comprises an amplifying element for signal amplification having a first current path and a first control terminal, an amplifying element for gain control at an output side having a second current path connected to a load at an output side and a second control terminal, an amplifying element for gain control at a non-output side having a third current path connected to a load at a non-output side and a third control terminal, and first and second negative feedback paths, so that an electric current, which corresponds to an input signal input to the first control terminal and amplified by a gain determined by control signals input to the second and third control terminals, will flow to the load at the output side via the second current path, wherein the amplifying element for signal amplification, the amplifying element for gain control at the output side, and the amplifying element for gain control at the non-output side are connected to one another such that a current flowing in the first current path will dividedly flow to the second and third current paths, the first negative feedback path connects the second current path to the first control terminal, in order to return a feedback signal according to an amount of a current flowing in the load at the output side to the first control terminal, and the second negative feedback path connects the third current path to the first control terminal, in order to return a feedback signal according to an amount of a current flowing in the load at the non-output side to the first control terminal, and the differential amplifier causes electric currents, which correspond to input signals input to the first control terminals of the first and second variable gain amplifiers and amplified by gains determined by control signals input to the second and third control terminals of the first and second variable gain amplifiers, to flow to the respective loads at the output side via the second current paths of the first and second variable gain amplifiers.

In the above-described variable gain amplifier or the differential amplifier, it is preferred that an impedance of the load at the output side and an impedance of the load at the non-output side be substantially equal to each other, and it is preferred that a circuit constant of the first negative feedback path and a circuit constant of the second feedback path be substantially equal to each other.

The first and second negative feedback paths may each comprise a buffer circuit for receiving and buffering the feedback signal, and outputting it to the first control terminal.

A supply source for a power to drive each of the buffer circuits may be different from a supply source for the current flowing in each of the loads.

The amplifying element for signal amplification, for gain control at the output side, or for gain control at the non-output side may comprise, for example, a bipolar transistor. In this case, the control terminal of the amplifying element may comprise a base of the bipolar transistor, and one end and the other end of the current path of the amplifying element may comprise an emitter and a collector of the bipolar transistor.

Alternatively, the amplifying element for signal amplification, for gain control at the output side, or for gain control at the non-output side may comprise a field effect transistor. In this case, the control terminal of the amplifying element may comprise a gate of the field effect transistor, and one end and the other end of the current path of the amplifying element may comprise a source and a drain of the field effect transistor.

BRIEF DESCRIPTION OF THE DRAWINGS

These objects and other objects and advantages of the present invention will become more apparent upon reading of the following detailed description and the accompanying drawings in which:

FIG. 6A is a graph showing a relationship between gain control voltage and Noise Figure, regarding the differential amplifier of FIG. 2;

FIG. 6B is a graph showing a relationship between gain control voltage and S parameter $S_{11}$ indicating input reflection characteristic, regarding the differential amplifier of FIG. 2;

FIG. 6C is a graph showing a relationship between gain control voltage and S parameter $S_{21}$ indicating input transmission characteristic, regarding the differential amplifier of FIG. 2;

FIG. 6D is a graph showing a relationship between gain control voltage and Third Order Input Intercept Point, regarding the differential amplifier of FIG. 2;

FIG. 7A is a graph showing a relationship between gain control voltage and Noise Figure, regarding the differential amplifier of FIG. 4;

FIG. 7B is a graph showing a relationship between gain control voltage and $S_{11}$, regarding the differential amplifier of FIG. 4;

FIG. 7C is a graph showing a relationship between gain control voltage and $S_{21}$, regarding the differential amplifier of FIG. 4;

FIG. 7D is a graph showing a relationship between gain control voltage and Third Order Input Intercept Point, regarding the differential amplifier of FIG. 4;

FIG. 8B is a graph showing a relationship between gain control voltage and $S_{11}$, regarding the differential amplifier of FIG. 5;

FIG. 8C is a graph showing a relationship between gain control voltage and $S_{21}$, regarding the differential amplifier of FIG. 5;

FIG. 8D is a graph showing a relationship between gain control voltage and Third Order Input Intercept Point, regarding the differential amplifier of FIG. 5;

FIG. 11A is a graph showing a relationship between gain control voltage and Noise Figure, regarding the differential amplifier of FIG. 10;

FIG. 11B is a graph showing a relationship between gain control voltage and $S_{11}$, regarding the differential amplifier of FIG. 10;

FIG. 11C is a graph showing a relationship between gain control voltage and $S_{21}$, regarding the differential amplifier of FIG. 10;

FIG. 11D is a graph showing a relationship between gain control voltage and Third Order Input Intercept Point, regarding the differential amplifier of FIG. 10;

FIG. 14A is a graph showing a relationship between gain control voltage and Noise Figure, regarding the differential amplifier of FIG. 13;

FIG. 14C is a graph showing a relationship between gain control voltage and $S_{21}$, regarding the differential amplifier of FIG. 13;

FIG. 15A is a graph showing a relationship between gain control voltage and Noise Figure, regarding a case where the gain variable range of the differential amplifier of FIG. 13 is 40 dB;

FIG. 15B is a graph showing a relationship between gain control voltage and S11, regarding the case where the gain variable range of the differential amplifier of FIG. 13 is 40 dB;

FIG. 15C is a graph showing a relationship between gain control voltage and $S_{21}$, regarding the case where the gain variable range of the differential amplifier of FIG. 13 is 40 dB; and FIG. 15D is a graph showing a relationship between gain control voltage and Third Order Input Intercept Point, regarding the case where the gain variable range of the differential amplifier of FIG. 13 is 40 dB.

DETAILED DESCRIPTION OF THE PREFERRED EMBODIMENTS

The embodiments of the present invention will now be explained with reference to the drawings.

First Embodiment

Figure 1:
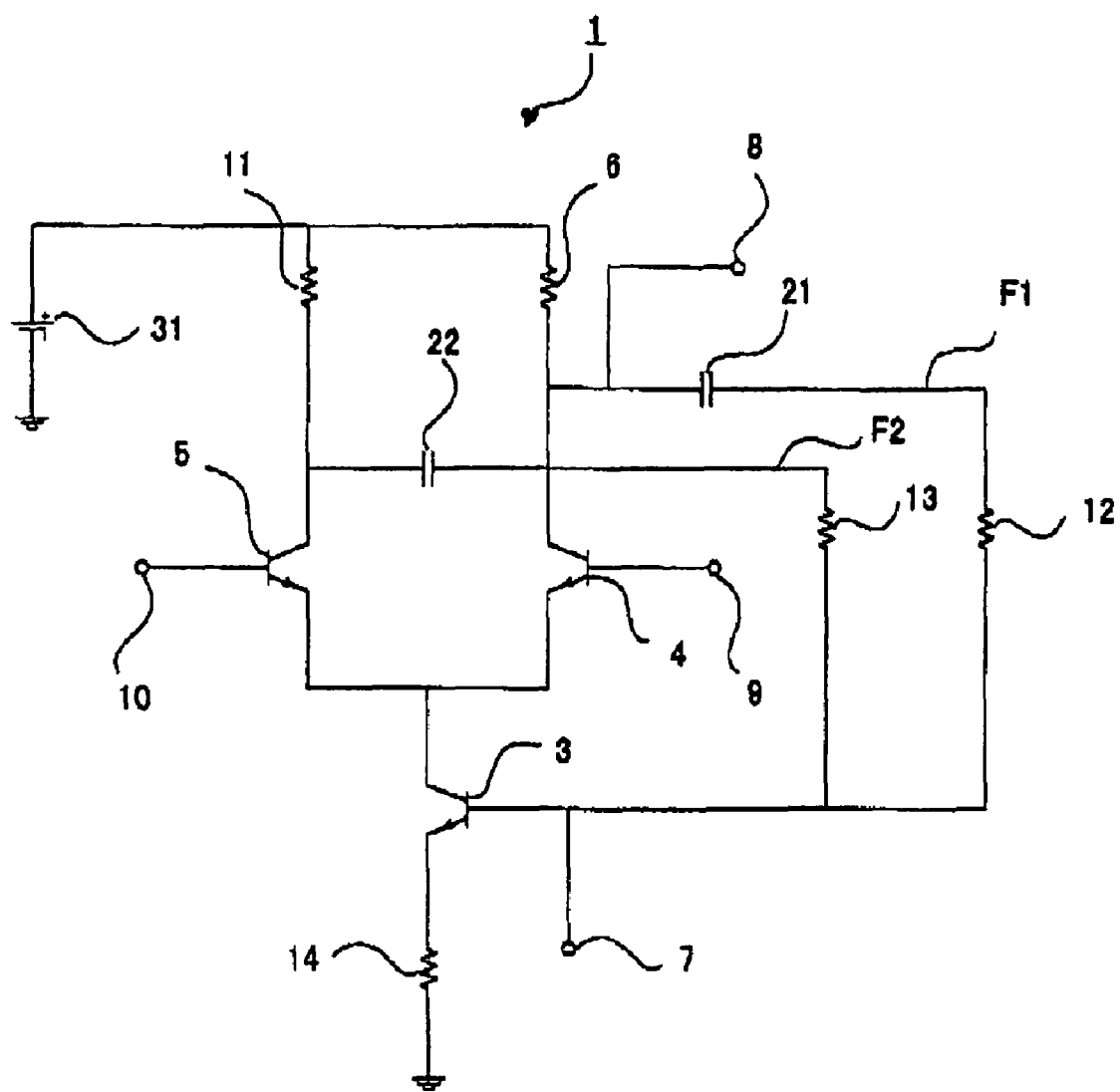
FIG. 1 is a circuit diagram showing a structure of a variable gain amplifier according to a first embodiment of the present invention.

FIG. 1 is a circuit diagram showing the structure of a variable gain amplifier 1 according to the first embodiment of the present invention. Note that in each circuit diagram of the drawings of the present application, two connection paths that form a T-shaped path are electrically connected to each other. Two connection paths that form a crossroad in each of these circuit diagrams are not electrically connected to each other.

In the variable gain amplifier 1 shown in FIG. 1, a signal amplifying transistor 3, a gain control transistor 4 at the output side, and a gain control transistor 5 at the non-output side all comprise a bipolar transistor. Hereinafter, the gain control transistor at the output side will be indicated as "output-side transistor", and the gain control transistor at the non-output side will be indicated as "non-output-side transistor".

The base of the signal amplifying transistor 3 is connected to an input terminal 7, and its emitter is grounded via a resistor 14. The collector of the signal amplifying transistor 3 is connected to the emitter of the output-side transistor 4 and the emitter of the non-output-side transistor 5. The collector of the output-side transistor 4 is connected to an output terminal 8. The collector of the output-side transistor 4 is also connected to a voltage source 31 via an output load 6. Furthermore, the collector of the output-side transistor 4 is connected to the input terminal 7 via a negative feedback path F1. The negative feedback path F1 comprises a capacitor 21 and a resistor 12 which are connected to each other in series.

On the other hand, the collector of the non-output-side transistor 5 is connected to the voltage source 31 via a load 11, which has substantially the same impedance as the output load 6. The collector of the non-output-side transistor 5 is also connected to the input terminal 7 via a negative feedback path F2. The negative feedback path F2 comprises a capacitor 22 and a resistor 13 which are connected to each other in series.

The base of the output-side transistor 4 is connected to a $v_{agc}$+ terminal 9, and the base of the non-output-side transistor 5 is connected to a $v_{agc}-$ terminal 10. A gain control voltage $v_{agc}+$ is input to the $v_{agc}+$ terminal 9, and a gain control voltage $v_{agc}-$ is input to the $v_{agc}-$ terminal 10.

The operation of the variable gain amplifier 1 will now be explained. When a signal is input to the input terminal 7, the signal is supplied to the base of the signal amplifying transistor 3. As a result, a collector current corresponding to the amplified version of this signal flows into the collector of the signal amplifying transistor 3. The collector current flows into the grounding resistor 14, and also flows into the emitter of the output-side transistor 4 and the emitter of the non-output-side transistor 5. The collector current in the output-side transistor 4 flows into the output load 6 to generate a voltage drop across the both ends of the output load 6. As a result, a change in the collector current is converted into a change in the voltage of the output terminal 8. The voltage of the output terminal 8 is output as an output signal.

The collector current of the signal amplifying transistor 3 is equal to the sum of the collector current of the output-side transistor 4 and that of the non-output-side transistor 5. How the collector current of the signal amplifying transistor 3 is divided to the collector current of the output-side transistor 4 and to the collector current of the non-output-side transistor 5 is controlled by the gain control voltage $v_{agc}+$ supplied to the base of the output-side transistor 4 via the $v_{agc}+$ terminal 9, and the gain control voltage $v_{agc}-$ supplied to the base of the non-output-side transistor 5 via the $v_{agc}-$ terminal 10. The gain of the variable gain amplifier 1 is changed by changing the manner of this division. For example, in a case where it is desired that the gain be increased, the collector current in the output-side transistor 4 may be increased by raising the gain control voltage $v_{agc}+$. To the contrary, in a case where it is desired that the gain be reduced, the collector current in the non-output-side transistor 5 may be increased by raising the gain control voltage $v_{agc}-$.

The circuit constants (specifically, the impedance) of the negative feedback path F1 and negative feedback path F2 are substantially equal to each other. Therefore, assuming that the value of a predetermined reference potential is $V_0$, by setting the gain control voltages $v_{agc}+$ and $v_{agc}-$ such that the arithmetic average of the electric potential of the base of the output-side transistor 4 and the electric potential of the base of the non-output-side transistor 5 will be equal to the reference potential $V_0$, the total of the amounts of negative feedback through the negative feedback path F1 and the negative feedback path F2 will be constant regardless of changes in the gain of the variable gain amplifier 1. Thus, the variable gain amplifier 1 can achieve an almost constant input reflection characteristic irrespective of the gain, and a fine input matching characteristic over a wide band. Furthermore, a distortion characteristic which is almost constant regardless of the gain can be obtained.

Besides, the negative feedback path F1 and negative feedback path F2 of the variable gain amplifier 1 both comprise only passive elements. Thus, particularly, a high-speed operation is available, and a less power-consuming operation can be achieved since no extra current is required.

Second Embodiment

Figure 2:
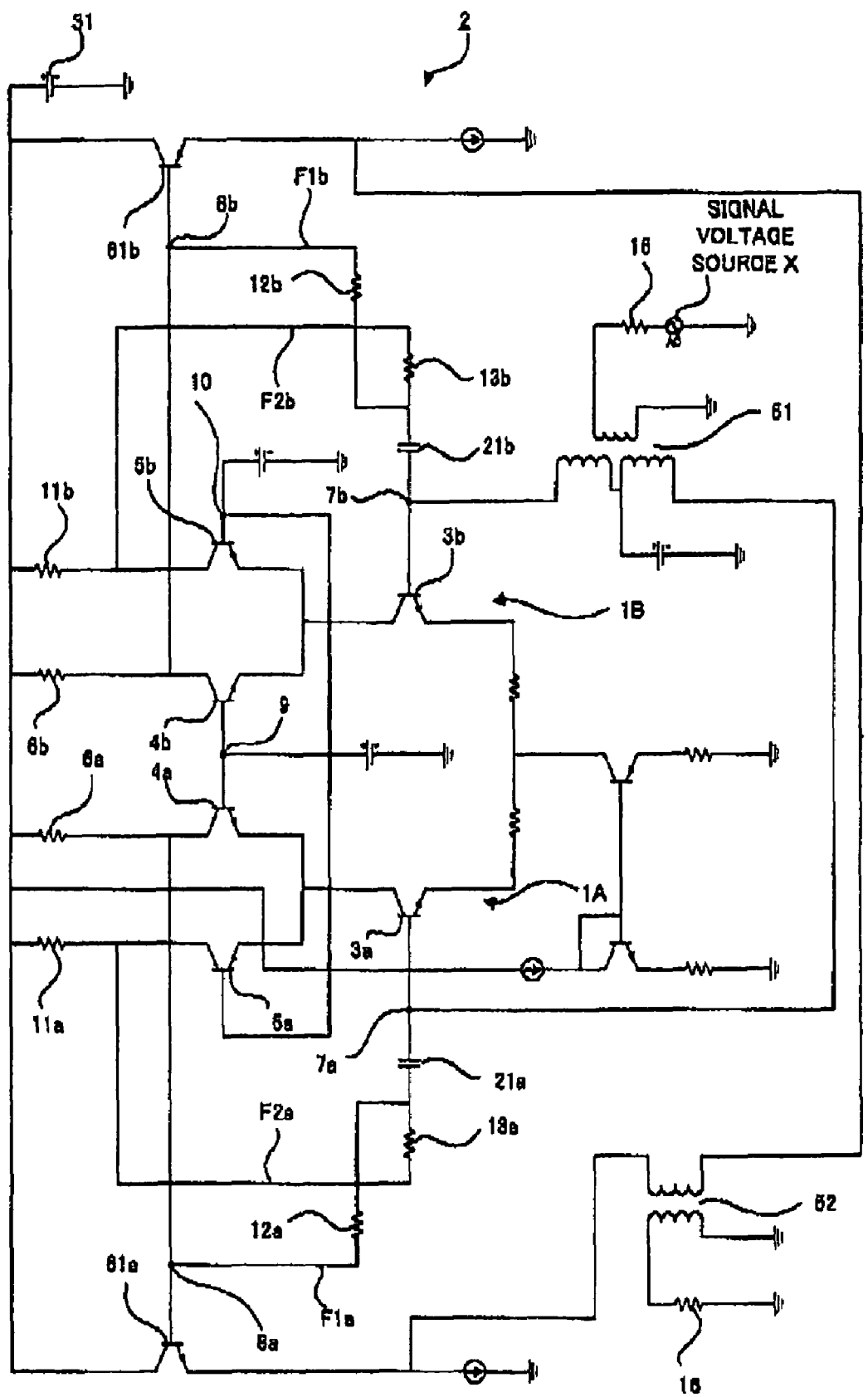
FIG. 2 is a circuit diagram showing a structure of a differential amplifier according to a second embodiment of the present invention.

FIG. 2 is a circuit diagram showing a structure of a differential amplifier 2 according to the second embodiment of the present invention.

The differential amplifier 2 shown in FIG. 2 comprises variable gain amplifier circuits corresponding to the variable gain amplifier of FIG. 1. That is, as shown in FIG. 2, the differential amplifier 2 comprises a variable gain amplifier circuit 1A for amplifying a positive-phase signal, and a variable gain amplifier circuit 1B for differentially amplifying an inverse-phase signal. The structures of the variable gain amplifier circuits 1A and 1B are substantially the same. The variable gain amplifier circuit 1A comprises a signal amplifying transistor 3a, an output load 6a, an output terminal 8a, an output-side transistor 4a, a non-output-side transistor 5a, an input terminal 7a, and a load 11a. The variable gain amplifier circuit 1B comprises a signal amplifying transistor 3b, an output load 6b, an output terminal 8b, an output-side transistor 4b, a non-output-side transistor 5b, an input terminal 7b, and a load 11b. The signal amplifying transistors 3a and 3b correspond to the signal amplifying transistor 3 of the variable gain amplifier 1. Likewise, the output loads 6a and 6b correspond to the output load 6, the output terminals 8a and 8b to the output terminal 8, the output-side transistors 4a and 4b to the output-side transistor 4, the non-output-side transistors 5a and 5b to the non-output-side transistor 5, the input terminals 7a and 7b to the input terminal 7, and the loads 11a and 11b to the load 11.

The base of the signal amplifying transistor 3a is connected to the input terminal 7a, and the base of the signal amplifying transistor 3b is connected to the input terminal 7b. The emitters of the signal amplifying transistors 3a and 3b are both grounded via a common constant current source.

The collector of the signal amplifying transistor 3a is connected to the emitters of the output-side transistor 4a and non-output-side transistor 5a. The collector of the signal amplifying transistor 3b is connected to the emitters of the output-side transistor 4b and non-output-side transistor 5b.

The collector of the output-side transistor 4a is connected to a voltage source 31 via the output load 6a. The collector of the output-side transistor 4b is connected to the voltage source 31 via the output load 6b.

The collector of the output-side transistor 4a is connected to the output terminal 8a. The collector of the output-side transistor 4b is connected to the output terminal 8b.

The collector of the output-side transistor 4a is connected to the input terminal 7a via a negative feedback path F1a. The negative feedback path F1a comprises a capacitor 21a and a resistor 12a which are connected to each other in series. The collector of the output-side transistor 4b is connected to the input terminal 7b via a negative feedback path F1b. The negative feedback path F1b comprises a capacitor 21b and a resistor 12b which are connected to each other in series. The circuit constants of the negative feedback paths F1a and F1b, and negative feedback paths F2a and F2b are substantially the same as one another.

The collector of the non-output-side transistor 5a is connected to the voltage source 31 via the load 11a. The collector of the non-output-side transistor 5b is connected to the voltage source 31 via the load 11b. The output load 6a, the output load 6b, the load 11a and the load 11b have substantially the same impedance.

The collector of the non-output-side transistor 5a is connected to the input terminal 7a via the negative feedback path F2a. The negative feedback path F2a comprises the capacitor 21a and a resistor 13a which are connected to each other in series. The collector of the non-output-side transistor 5b is connected to the input terminal 7b via the negative feedback path F2b. The negative feedback path F2b comprises the capacitor 21b and a resistor 13b which are connected to each other in series. (That is, the capacitor 21a is a constitutional element for both the negative feedback paths F1a and F2a, and the capacitor 21b is a constitutional element for both the negative feedback paths F1b and F2b.)

The bases of the output-side transistors 4a and 4b are connected to a common $v_{agc}+$ terminal 9, and the bases of the non-output-side transistors 5a and 5b are connected to a common $v_{agc}-$ terminal 10. A gain control voltage $v_{agc}+$ is input to the $v_{agc}+$ terminal 9, and a gain control voltage $v_{agc}-$ is input to the $v_{agc}-$ terminal 10.

In the differential amplifier 2, by setting the gain control voltages $v_{agc}+$ and $v_{agc}-$ such that the arithmetic average of the electric potential at the base of the output-side transistor 4a and the electric potential at the base of the non-output-side transistor 5a, and the arithmetic average of the electric potential at the base of the output-side transistor 4b and the electric potential at the base of the non-output-side transistor 5b will both be equal to a reference potential $V_0$, the total of the amounts of negative feedback through the negative feedback paths F1a and F2a will be constant regardless of changes of the gain in the variable gain amplifier circuit 1A. Further, in this case, the total of the amounts of negative feedback through the negative feedback paths F1b and F2b will be constant regardless of changes of the gain in the variable gain amplifier circuit 1B. Accordingly, in the differential amplifier 2, an almost constant input reflection characteristic can be obtained regardless of the gain, and a favorable input matching characteristic can be obtained over a wide band. Furthermore, an almost constant distortion characteristic can be obtained regardless of the gain.

In the structure shown in FIG. 2, a current which a signal voltage source X causes to flow into a terminating resistor 15 is caused to flow into a primary winding of a transformer 51, and a pair of signals induced in a pair of secondary windings of the transformer 51 are balanced-input to the bases of the signal amplifying transistors 3a and 3b in one-to-one correspondence.

Further, in the structure shown in FIG. 2, the collector voltage of the output-side transistor 4a buffered by an emitter follower circuit comprising a transistor 61a and the collector voltage of the output-side transistor 4b buffered by an emitter follower circuit comprising a transistor 61b generate a pair of differential signals, which are applied across the both ends of a primary winding of a transformer 52 and induce a voltage across the both ends of a secondary winding of the transformer 52, which voltage drives a load 16 and thereby realizes a balanced output.

Figure 12:
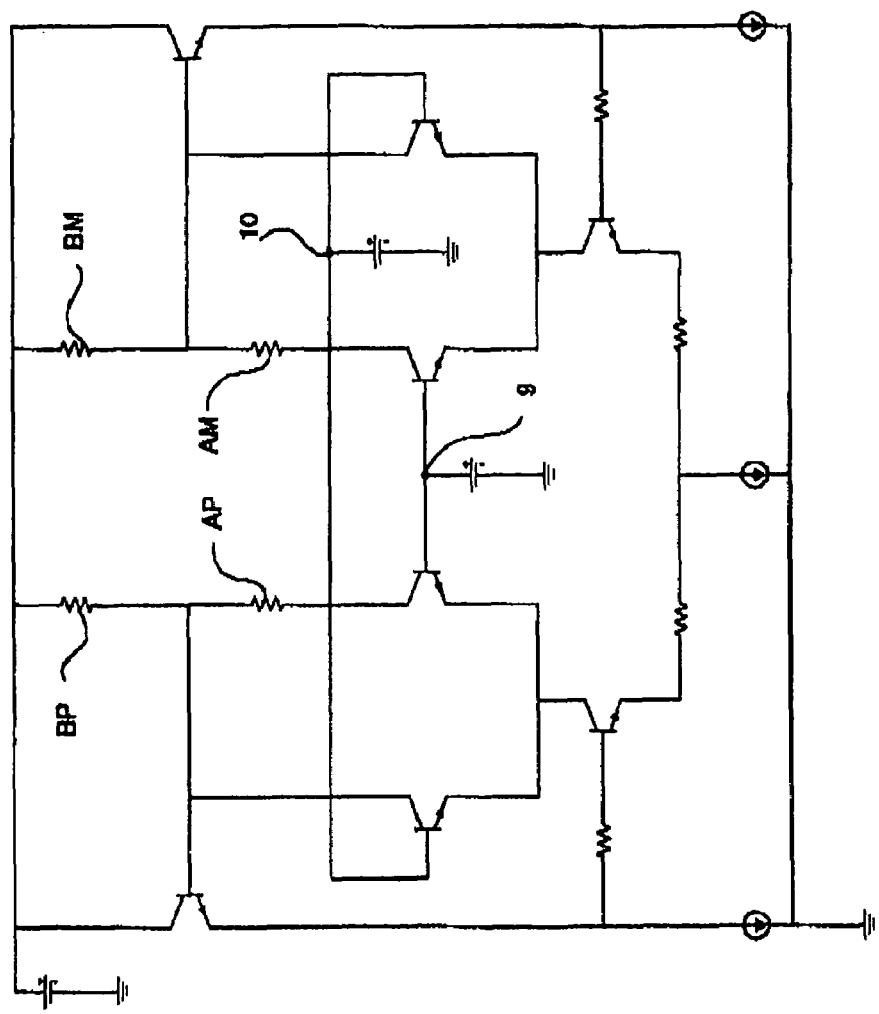
FIG. 12 is a circuit diagram showing a structure of a differential amplifier according to the Prior Art 2.
Figure 13:
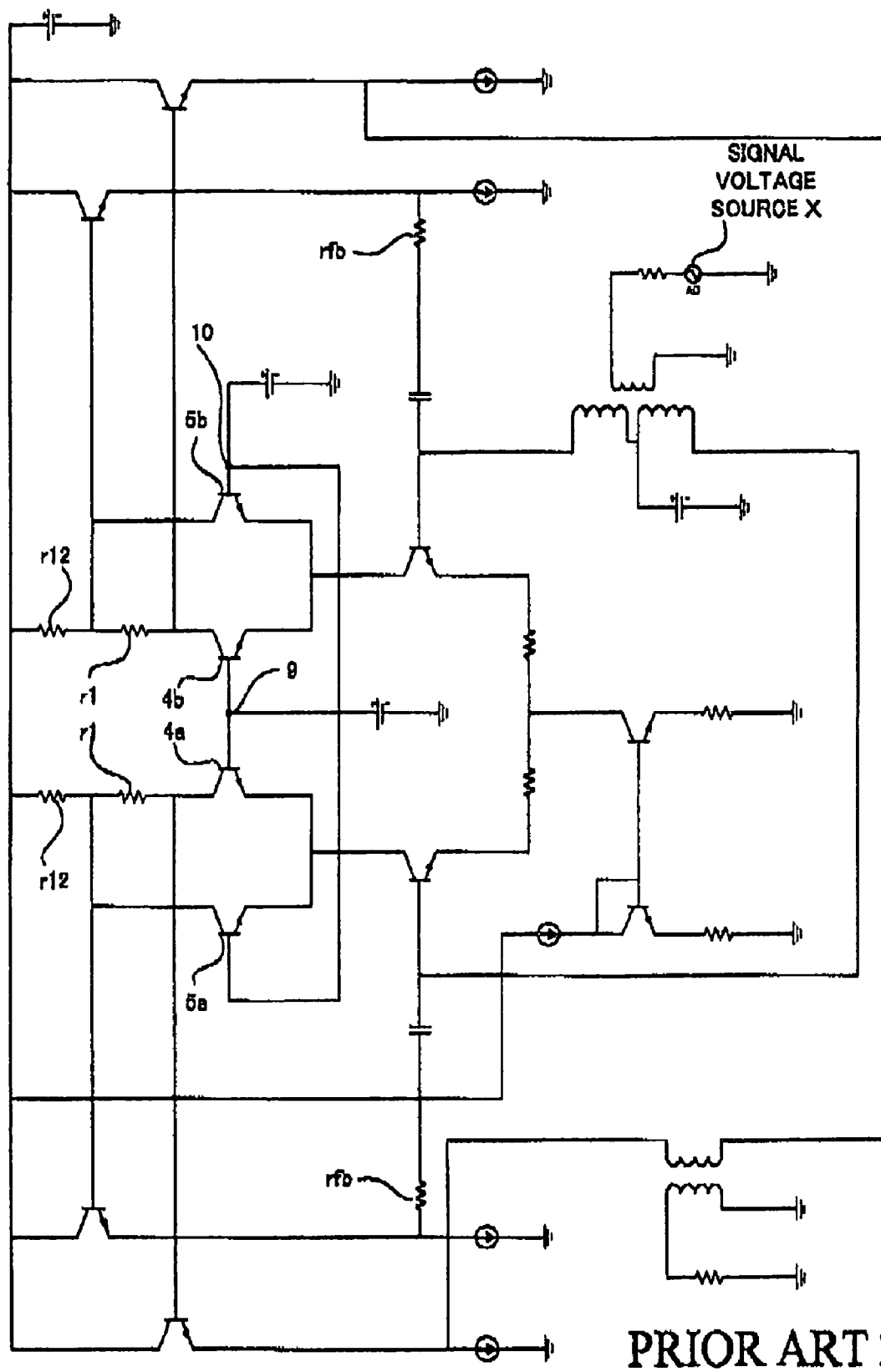
FIG. 13 is a circuit diagram showing another structure of the differential amplifier according to the Prior Art 2.
Figure 14B:
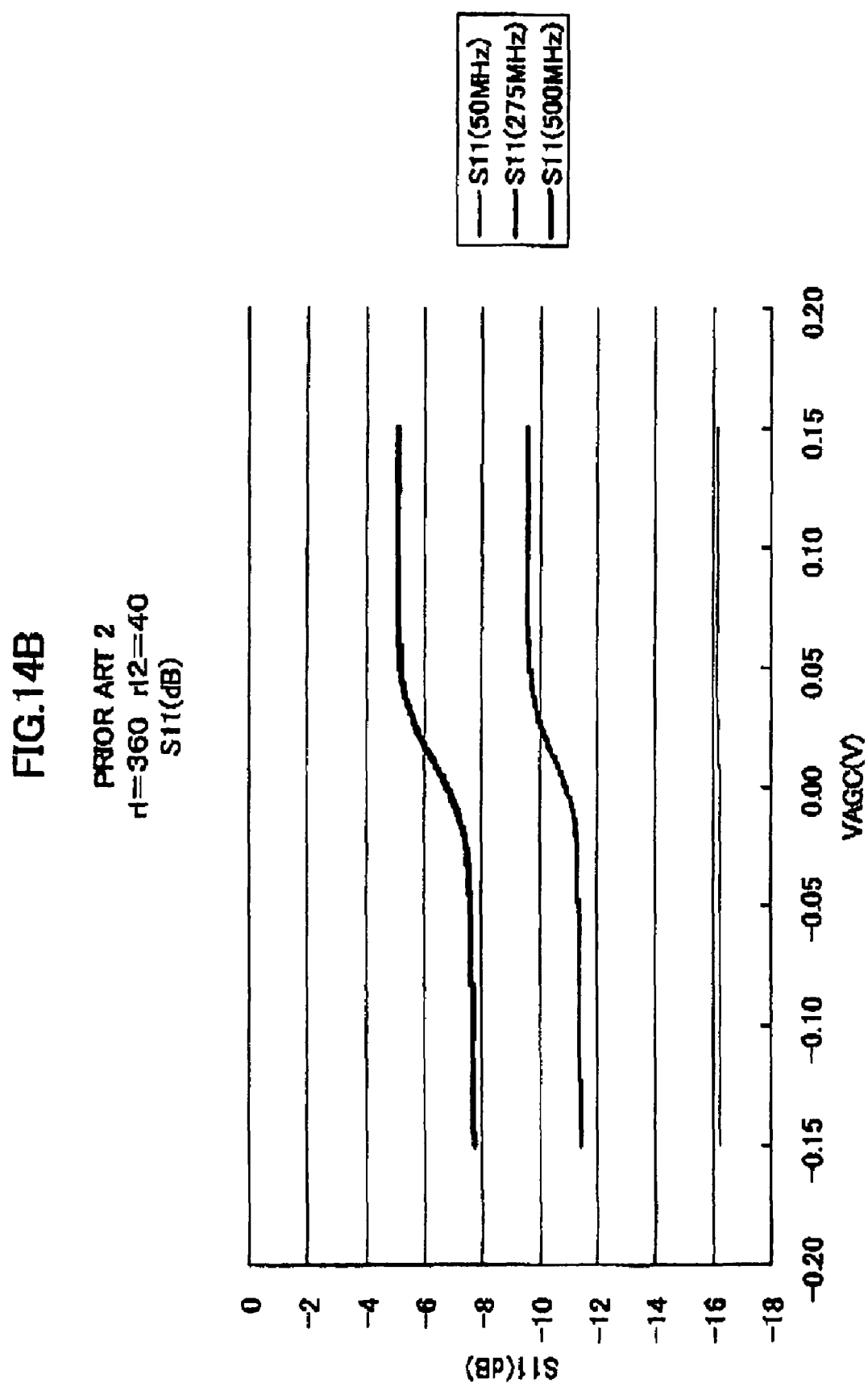
FIG. 14B is a graph showing a relationship between gain control voltage and $S_{11}$, regarding the differential amplifier of FIG. 13.
Figure 14D:
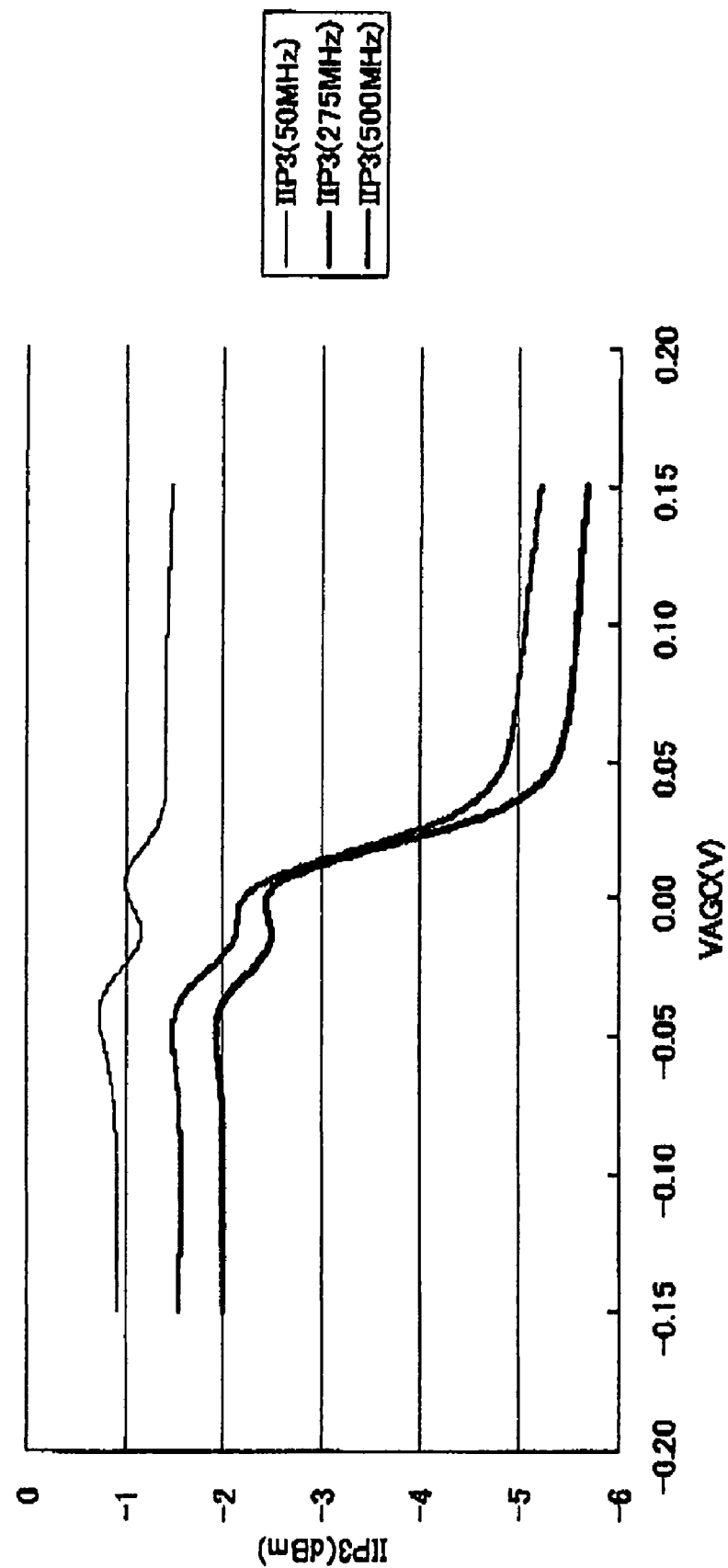
FIG. 14D is a graph showing a relationship between gain control voltage and Third Order Input Intercept Point, regarding the differential amplifier of FIG. 13.

The differential amplifier 2 (or the variable gain amplifier 1 in the FIG. 1) can be normally operated even when the resistance values of the output loads 6a and 6b are set to about 100 ohms e.g., securing over 40 dB variable gain range, while the resistance value of BP and BM will become only about 1 ohm, which is too small to obtain a meaningful amount of feedback, if the same output load resistance value, 100 ohms, and 40 dB gain variable range specification are applied in the structure of the above-described Prior Art 2 in FIG. 12. In turn, this means the differential amplifier 2 and the variable gain amplifier 1 are less apt to be harmed by the Miller effect in comparison with the structure of the Prior Art 2, in case of high frequency operations.

Further, according to the present invention, a gain variable range of about 40 dB can be secured over a wide band. In the structure of the Prior Art 2, it is difficult to obtain fine input matching, noise figure characteristic, and distortion characteristic simultaneously, in a case where the gain variable range is increased to about 40 dB. In contrast, according to the present invention, it is possible to simultaneously realize a fine input matching and a fine noise figure characteristic in a gain variable range of about 40 dB over a wide band.

Furthermore, the negative feedback paths F1a, F1b, F2a, and F2b of the differential amplifier 2 all comprise only passive elements. Therefore, particularly, a high-speed operation is available, and a less power-consuming operation can be achieved since no extra current is required.

Third Embodiment

Figure 3:
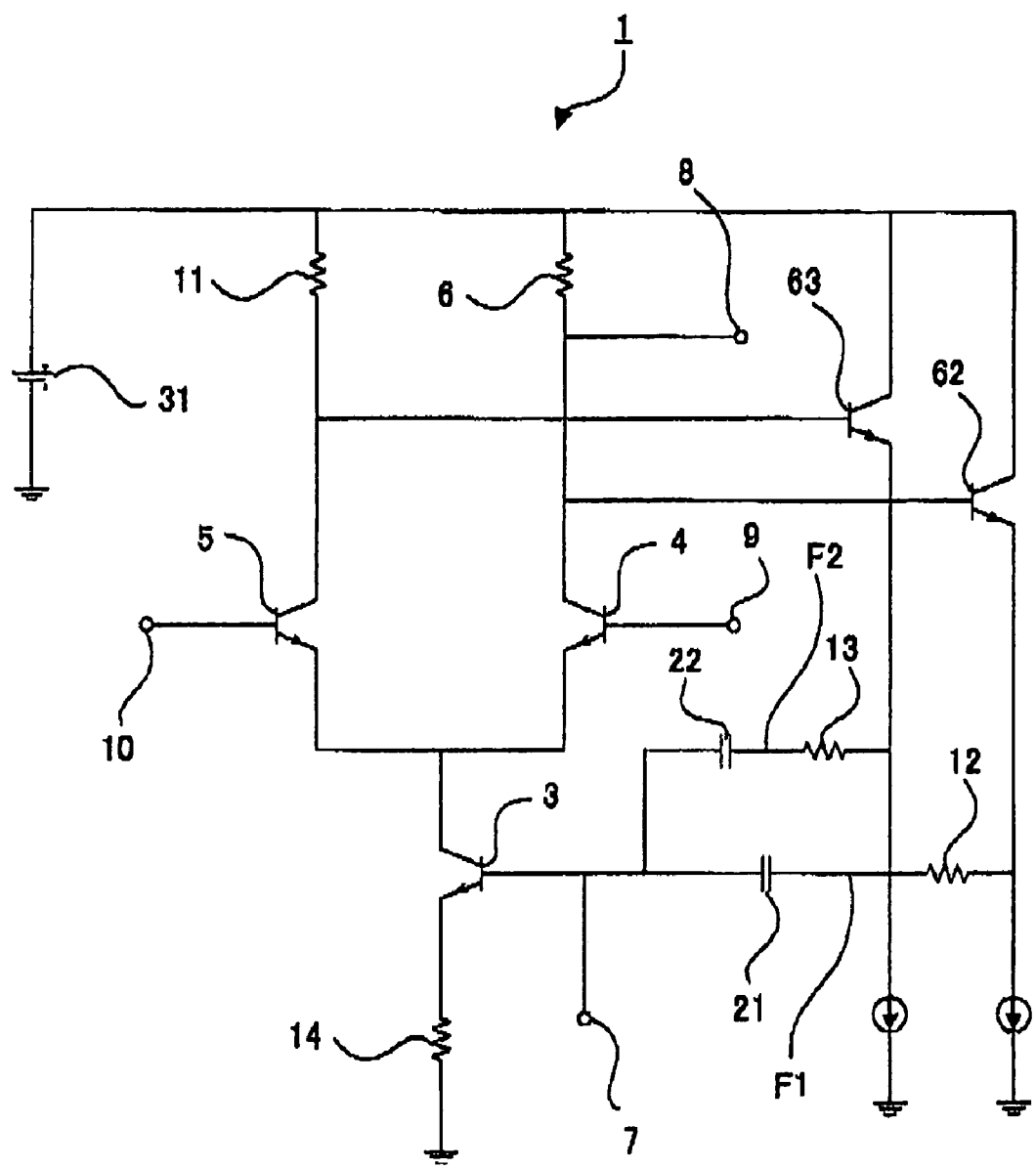
FIG. 3 is a circuit diagram showing a structure of a variable gain amplifier according to a third embodiment of the present invention.

FIG. 3 is a circuit diagram showing a structure of a variable gain amplifier 1 according to the third embodiment of the present invention. The variable gain amplifier 1 shown in FIG. 3 is substantially the same as the structure shown in FIG. 1, except that each of the negative feedback paths F1 and F2 further includes an emitter follower circuit.

In the structure of FIG. 3, the collector voltage of an output-side transistor 4 is buffered in an emitter follower circuit comprising a transistor 62, and the buffered collector voltage is connected to an input terminal 7 via a series circuit comprising a resistor 12 and a capacitor 21. Likewise, the collector voltage of a non-output-side transistor 5 is buffered in an emitter follower circuit comprising a transistor 63, and connected to the input terminal 7 via a series circuit comprising a resistor 13 and a capacitor 22. The resistors 12 and 13 and the capacitors 21 and 22 are substantially the same as those shown in FIG. 1, respectively.

In the structure of FIG. 3, it is possible to prevent a signal from being reversely transmitted to the output terminal 8 from the input terminal 7 via the negative feedback path F1 or F2, as compared to the structure of FIG. 1. Further, the connection between the collector of the output-side transistor 4 and the collector of the non-output-side transistor 5 is not tight. Therefore, the variable gain amplifier 1 according to the third embodiment of the present invention can secure a wider gain variable range than the variable gain amplifier 1 according to the first embodiment.

Fourth Embodiment

Figure 4:
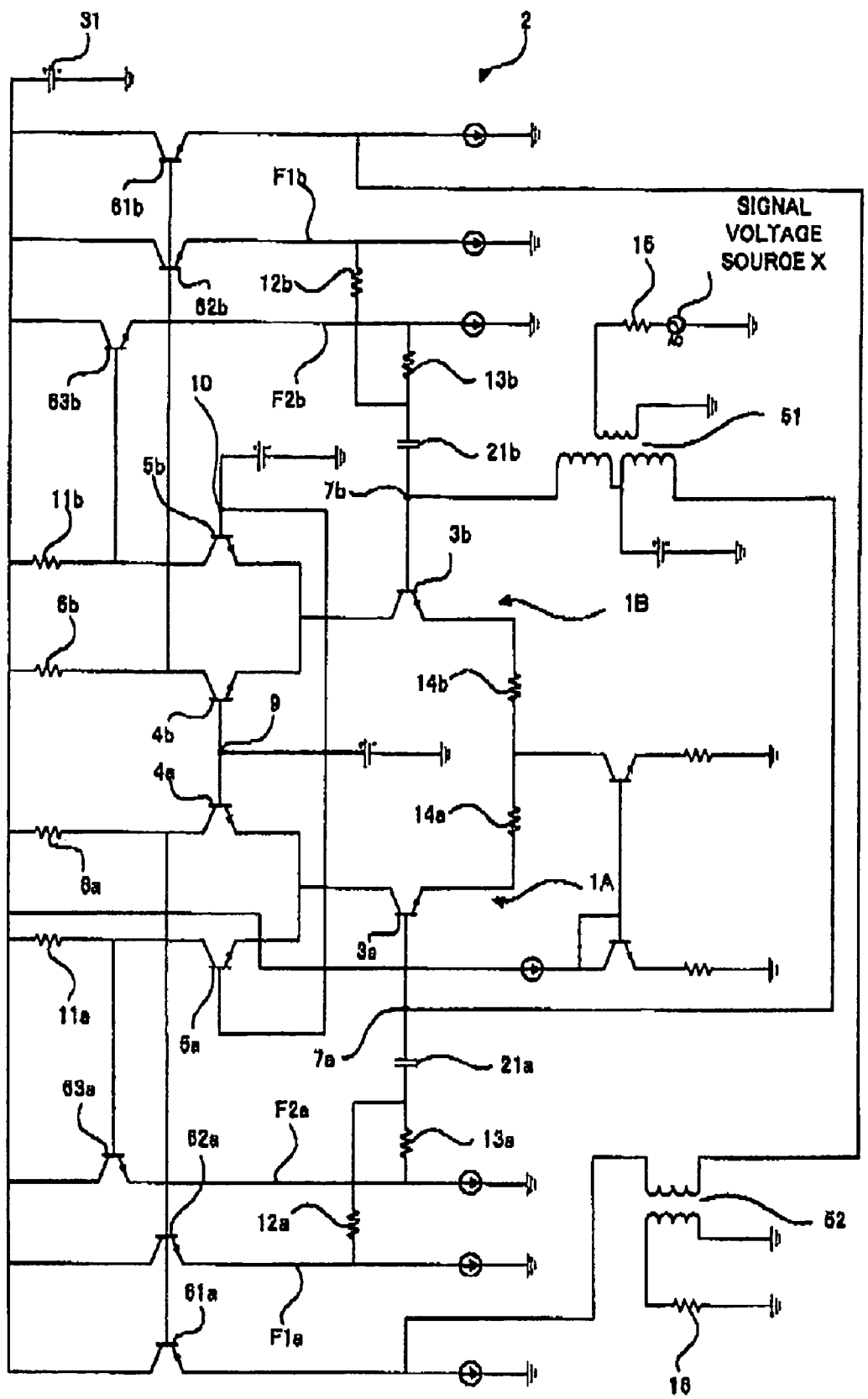
FIG. 4 is a circuit diagram showing a structure of a differential amplifier according to a fourth embodiment of the present invention.

FIG. 4 is a circuit diagram showing a structure of a differential amplifier 2 according to the fourth embodiment of the present invention. The differential amplifier 2 shown in FIG. 4 is substantially the same as the structure shown in FIG. 2, except that each of the negative feedback paths F1a, F1b, F2a, and F2b further includes an emitter follower circuit.

In the structure shown in FIG. 4, the collector voltage of an output-side transistor 4a is buffered in an emitter follower circuit formed of a transistor 62a, and the buffered collector voltage is connected to an input terminal 7a via a series circuit comprising a resistor 12a and a capacitor 21a. Likewise, the collector voltage of an output-side transistor 4b is buffered in an emitter follower circuit comprising a transistor 62b and connected to the input terminal 7b via a series circuit comprising a resistor 12b and a capacitor 21b. Further, the collector voltage of a non-output-side transistor 5a is buffered in an emitter follower circuit comprising a transistor 63a, and connected to the input terminal 7a via a series circuit comprising a resistor 13a and the capacitor 21a. Furthermore, the collector voltage of a non-output-side transistor 5b is buffered in an emitter follower circuit comprising a transistor 63b, and connected to the input terminal 7b via a series circuit comprising a transistor 13b and the capacitor 21b. The resistors 12a, 12b, 13a and 13b, and the capacitors 21a and 21b shown in FIG. 4 are substantially the same as those shown in FIG. 2 respectively. In the differential amplifier 2 of FIG. 4, a bias current for each of the above-described emitter follower circuits is acquired from a current flowing in an output load 6a or 6b, or a load 11a or 11b.

Also in the structure of FIG. 4, it is possible to prevent a signal from being reversely transmitted to each output terminal from each input terminal via each negative feedback path, as compared to the structure of FIG. 2. Further, the connection between the collector of each output-side transistor and the collector of each non-output-side transistor is not tight. Therefore, the differential amplifier 2 according to the fourth embodiment of the present invention can secure a wider gain variable range than the differential amplifier 2 according to the second embodiment.

Figure 5:
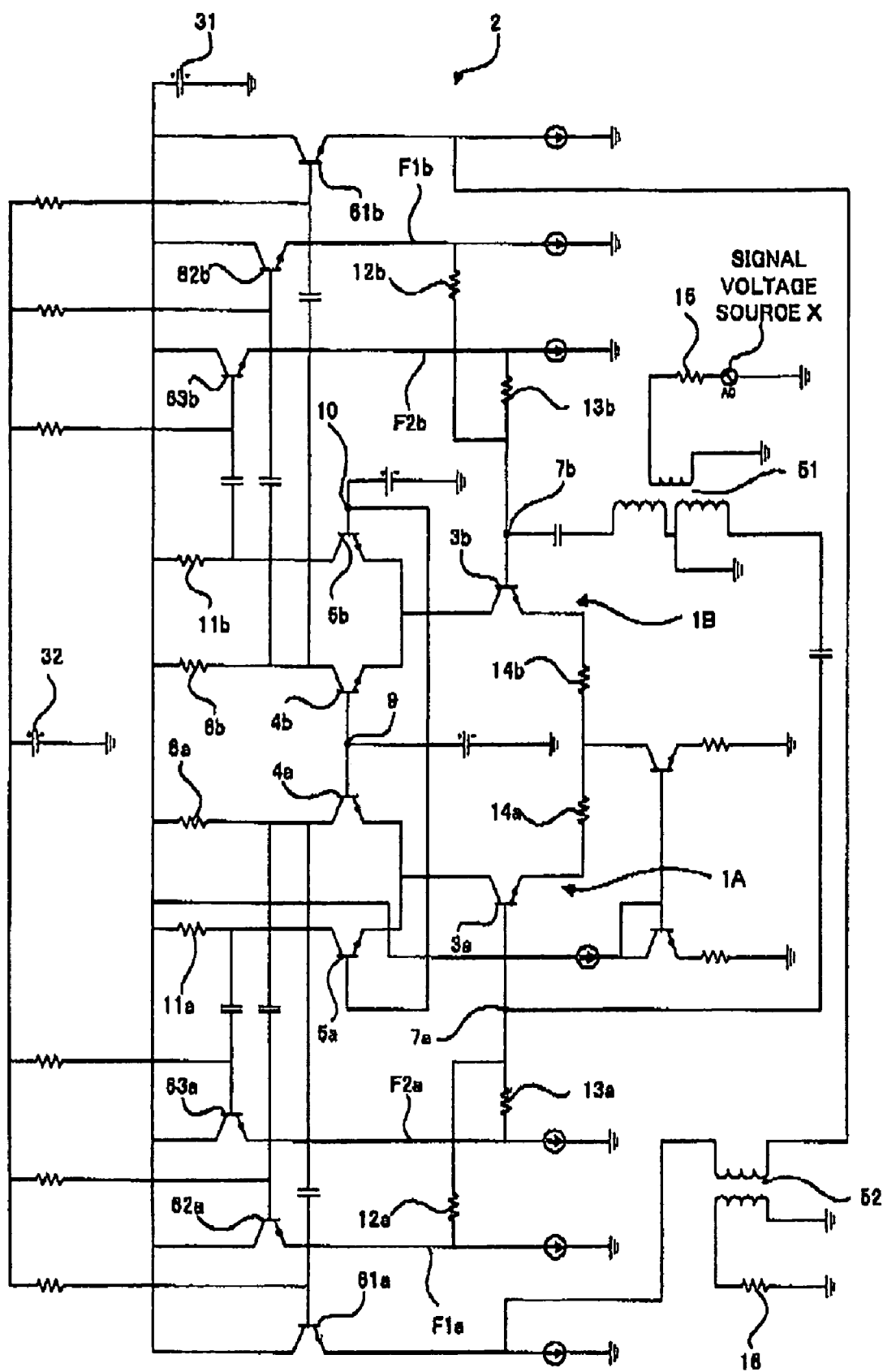
FIG. 5 is a circuit diagrams showing a structure of a modified embodiment of the differential amplifier of FIG. 4.

FIG. 5 is a diagram showing a modified embodiment of the differential amplifier 2 according to the above-described fourth embodiment. The differential amplifier 2 shown in FIG. 5 is different from the structure of FIG. 4, in that the bias current for each of the emitter follower circuits comprising transistors 61a, 62a, 63a, 61b, 62b, and 63b is supplied from a voltage source 32, which is different from a voltage source 31, which is the source of supplying a current flowing in the output loads 6a and 6b, and the loads 11a and 11b.

The bipolar transistors constituting the variable gain amplifiers and differential amplifiers according to the above-described first to fourth embodiments of the present invention may be replaced by field effect transistors (FET) of a MOS type or a junction type. In a case where the bipolar transistors are replaced by FETs, the collectors of the output-side transistor 4 and non-output-side transistor 5 are replaced with drains, the emitters thereof are replaced with sources, and the bases thereof are replaced with gates. Further, in a case where the bipolar transistor constituting each emitter follower circuit is replaced by an FET constituting a source follower circuit, this source follower circuit does not necessarily need to be supplied with a bias current.

The bipolar transistors constituting the variable gain amplifiers and differential amplifiers according to the first to fourth embodiments of the present invention may not be of an NPN type, but may be of a PNP type. In a case where the bipolar transistors are of a PNP type, the polarity of the voltage sources constituting the variable gain amplifiers and differential amplifiers may be inversed from the polarity of the case where the bipolar transistors are of an NPN type.

EXAMPLES

Next, the results of simulations conducted on the operations of the circuits according to the above-described second and fourth embodiments will be explained. The transistor model used in the simulations to be described below is the same as the transistor model used in the simulations on the structure of the Prior Art 1. The upper limit of the practical operating frequency of the transistor model used in these simulations is about 500 MHz. The LNA core current has also the same value as that in the simulations on the structure of the Prior Art 1.

Example 1

FIG. 6A shows a graph plotting the changes of Noise Figure (hereinafter referred to as NF) with respect to the changes of gain control voltage, regarding cases where the frequency of an input signal input to the differential amplifier 2 shown in FIG. 2 according to the second embodiment is 50 MHz, 275 MHz, and 500 MHz respectively. FIG. 6B shows a graph plotting the changes of S parameter $S_{11}$ indicating input reflection characteristic, with respect to the changes of gain control voltage, regarding the same cases. FIG. 6C shows a graph plotting the changes of S parameter $S_{21}$ indicating input transmission characteristic, with respect to the changes of gain control voltage, regarding the same cases. FIG. 6D shows a graph plotting the changes of Third Order Input Intercept Point (hereinafter referred to as IIP3) indicating intermodulation distortion characteristic, with respect to the changes of gain control voltage, regarding the same cases. In FIG. 6A to FIG. 6D, the plot of the case where the frequency of the input signal is 500 MHz is indicated by the boldest solid line, the plot of the case where the frequency is 275 MHz is indicated by the next boldest solid line, and the plot of the case where the frequency is 50 MHz is indicated by the thin solid line.

In the graphs shown in FIG. 6A to FIG. 6D, the value $V_{AGC}$ on the X axis indicates, in volt unit, the ½ value of the voltage at the $v_{agc}+$ terminal 9 in the structure of FIG. 2, with respect to the electric potential of the $v_{agc}-$ terminal 10 as a reference. As described above, the bases of the output-side transistors 4a and 4b are connected to the $v_{agc}+$ terminal 9, and the bases of the non-output-side transistors 5a and 5b are connected to the $V_{agc}-$ terminal 10. The gain fluctuations arising in accordance with the changes of the value $V_{AGC}$ are expressed by the changes of the value of $S_{21}$ shown in FIG. 6C. The simulations on the value of IIP3 were conducted under a setting that two tone signals having frequencies which were distanced from each other by 20 kHz were input at an intensity of −50 dBm.

With reference to the plots shown in FIG. 6C, it is known that gain dips appear in the $V_{AGC}$ range of −0.07V or higher to lower than −0.06V. With reference to FIG. 6A and FIG. 6D, it is known that local deteriorations of NF and IIP3 arise in accordance with these dips. These phenomena occur because the collector of the output-side transistor 4a and that of the output-side transistor 4b, and the collector of the non-output-side transistor 5a and that of the non-output-side transistor 5b are directly connected to each other by passive components, through which the amplified signals at the collector of the non-output-side transistor 5a and 5b can be transmitted to the output nodes 8a and 8b respectively, increasing the gain of the differential amplifier 2 in FIG. 2 when the signal strength from non-output-side transistors becomes larger beyond some limits.

However, with reference to FIG. 6B and FIG. 6D, it is known that the values of $S_{11}$ and IIP3 are both almost constant in the $V_{AGC}$ range of −0.06 or higher. Further, with reference to FIG. 6A, it is known that no extreme deterioration of NF occurs in this range.

Accordingly, in a case where a wide band variable gain amplifier is to be manufactured and the required specifications will be satisfied if a gain variable range of less than or equal to 30 dB is secured, such specifications can be satisfied by using the variable gain amplifier 1 or the differential amplifier 2 according to the first or the second embodiment of the present invention, and the manufactured wide band variable gain amplifier can save power consumption, and achieve other advantages described in the first or the second embodiments.

Example 2

FIG. 7A shows a graph plotting the changes of NF with respect to the changes of gain control voltage, regarding cases where the frequency of an input signal input to the differential amplifier 2 according to the fourth embodiment shown in FIG. 4 is 50 MHz, 275 MHz, and 500 MHz, respectively. FIG. 7B shows a graph plotting the changes of $S_{11}$ with respect to the changes of gain control voltage, regarding the same cases. FIG. 7C shows a graph plotting the changes of $S_{21}$ with respect to the changes of gain control voltage, regarding the same cases. FIG. 7D shows a graph plotting the changes of IIP3 with respect to the changes of gain control voltage, regarding the same cases. Also in FIG. 7A to FIG. 7D, the plot of the case where the frequency of the input signal is 500 MHz is indicated by the boldest solid line, the plot of the case where the frequency is 275 MHz is indicated by the next boldest solid line, and the plot of the case where the frequency is 50 MHz is indicated by the thin solid line.

In the graphs shown in FIG. 7A to FIG. 7D, the value $V_{AGC}$ on the X axis indicates, in volt unit, the ½ value of the voltage at the $v_{agc}$+ terminal 9 in the structure of FIG. 4, with respect to the electric potential of the $v_{agc}$− terminal 10 as a reference. Also in the structure of FIG. 4, as described above, the bases of the output-side transistors 4a and 4b are connected to the $v_{agc}$+ terminal 9, and the bases of the non-output-side transistors 5a and 5b are connected to the $v_{agc}$− terminal 10. The gain fluctuations arising in accordance with the changes of the value $V_{AGC}$ are expressed by the changes of the value of $S_{21}$ shown in FIG. 7C. Also in the Example 2, the simulations on the value of IIP3 were conducted under a setting that two tone signals having frequencies which were distanced from each other by 20 kHz were input at an intensity of −50 dBm.

With reference to FIG. 7C, it is known that there is no gain dip appearing in accordance with the fluctuations of $V_{AGC}$ according to the fourth embodiment, unlike the second embodiment. Further, with reference to FIG. 7D, it is known that the value of IIP3 is almost constant regardless of the changes of the gain, in a case where the frequency of the input signal is 50 MHz. The transistor model used in these simulations is such one that can be considered to show behaviors as an ideal bipolar transistor in a case where the frequency of the input signal is 50 MHz. With reference to FIG. 7A, it is known that NF at the time the gain of the structure of FIG. 4 reaches the maximum is 2.3 dB in the case where the frequency of the input signal is 50 MHz, and is 2.6 dB in the case where the frequency of the input signal is 500 MHz. Further, with reference to FIG. 7C, it is known that the structure of FIG. 4 can secure a gain variable range of 60 dB or wider in a band equal to or higher than 50 MHz and equal to or lower than 500 MHz.

The structure according to the fourth embodiment consumes more power than the structure according to the second embodiment, because of its additional inclusion of the emitter follower circuits. However, according to the structure of the fourth embodiment, it is possible to secure a gain variable range of about 60 dB, and also possible to secure the advantages described in the explanation of the first or the second embodiment.

Example 3

Figure 8A:
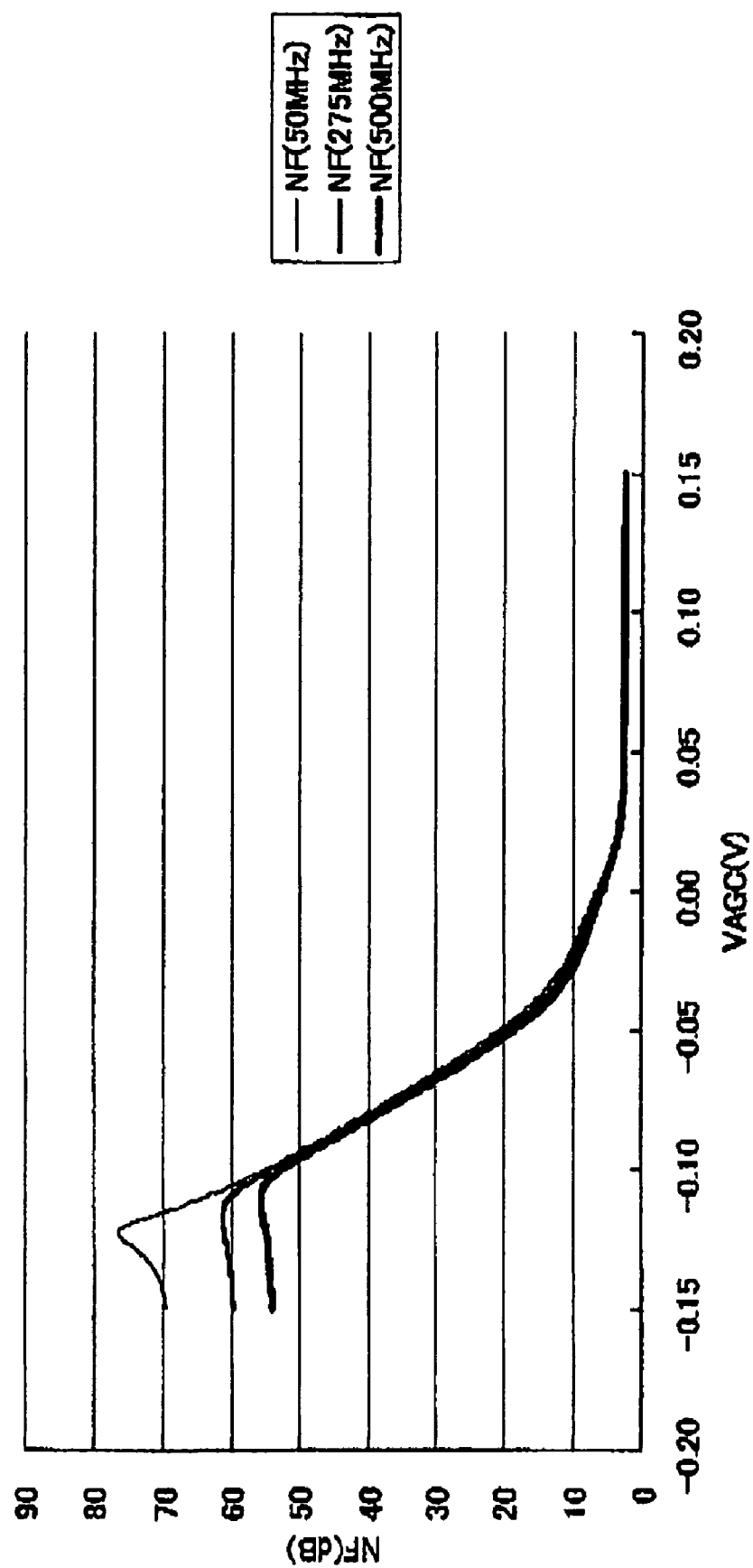
FIG. 8A is a graph showing a relationship between gain control voltage and Noise Figure, regarding the differential amplifier of FIG. 5.
Figure 9:
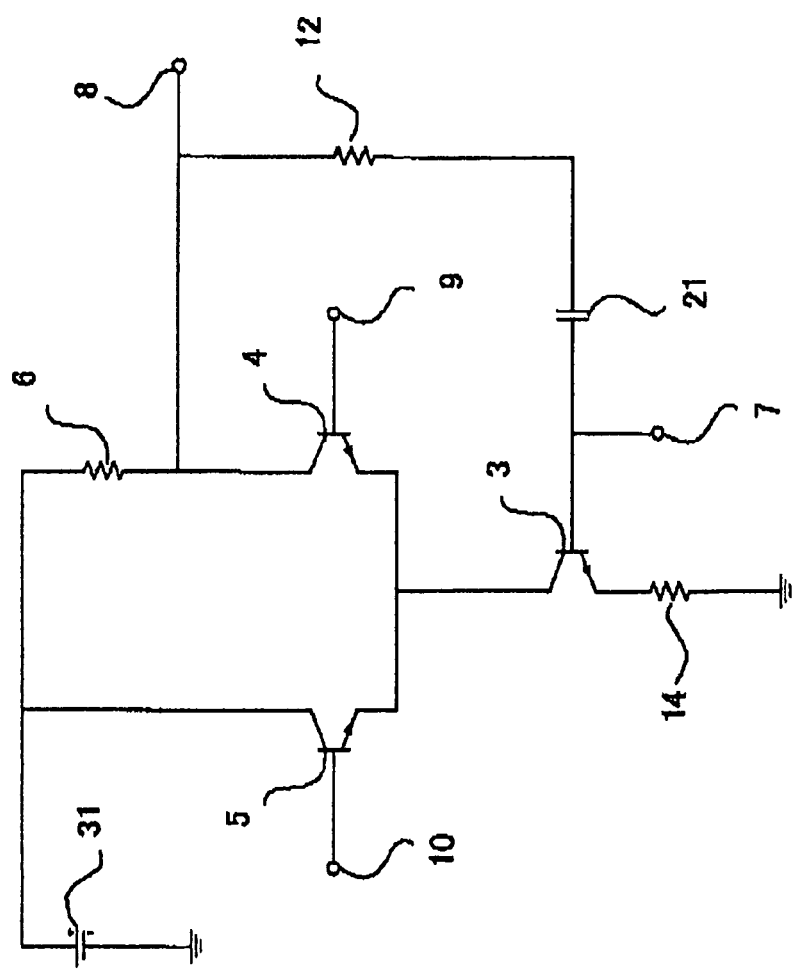
FIG. 9 is a circuit diagram showing a structure of a single-ended variable gain amplifier according to the Prior Art 1.
Figure 10:
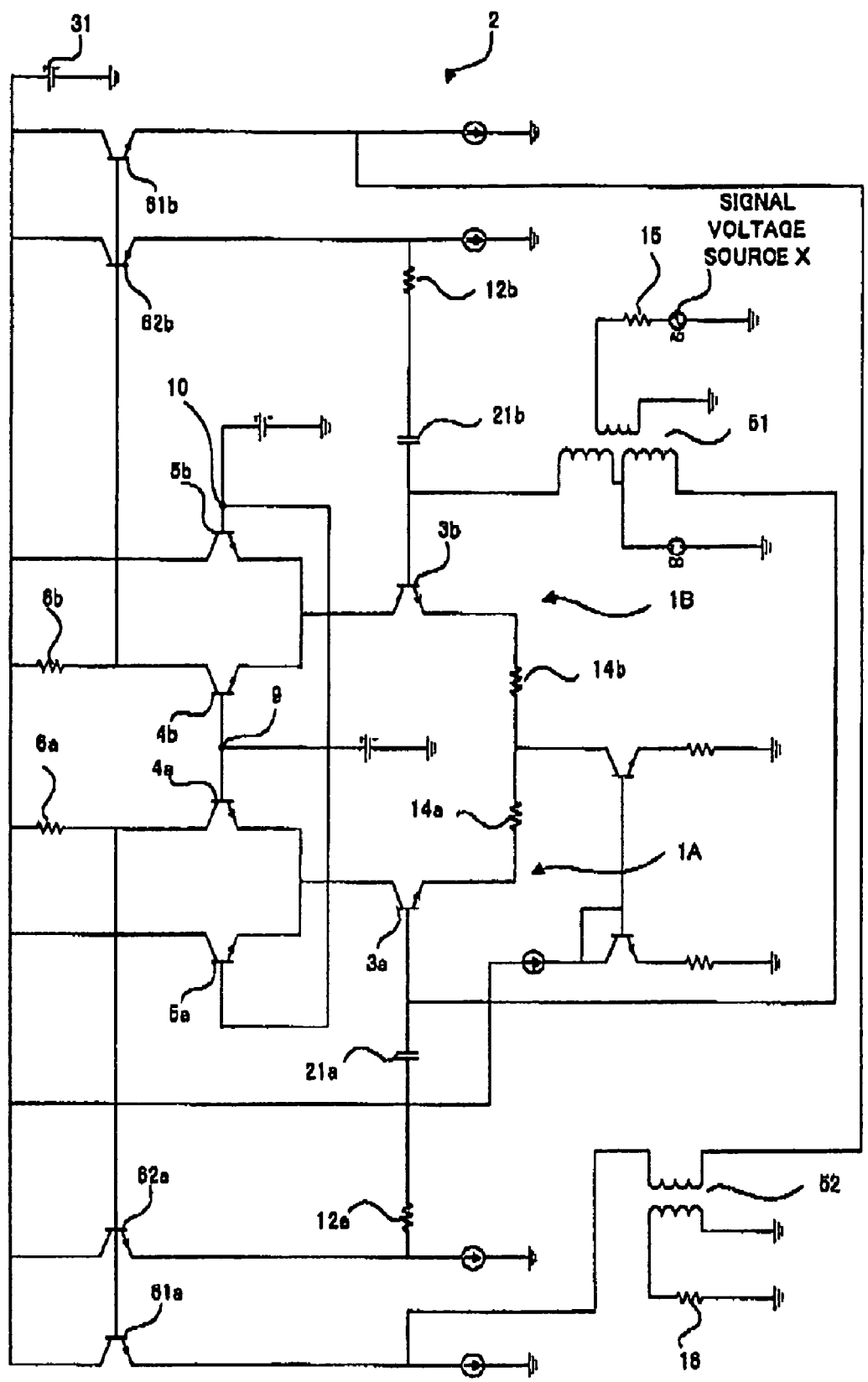
FIG. 10 is a circuit diagram of a differential amplifier comprising the variable gain amplifier circuit of FIG. 9.

FIG. 8A shows a graph plotting the changes of NF with respect to the changes of gain control voltage, regarding cases where the frequency of an input signal input to the differential amplifier 2 according to the modified embodiment of the fourth embodiment shown in FIG. 5 is 50 MHz, 275 MHz, and 500 MHz respectively. FIG. 8B shows a graph plotting the changes of $S_{11}$ with respect to the changes of gain control voltage, regarding the same cases. FIG. 8C shows a graph plotting the changes of $S_{21}$ with respect to the changes of gain control voltage, regarding the same cases. FIG. 8D shows a graph plotting the changes of IIP3 with respect to the changes of gain control voltage, regarding the same cases. Also in FIG. 8A to FIG. 8D, the plot of the case where the frequency of the input signal is 500 MHz is indicated by the boldest solid line, the plot of the case where the frequency is 275 MHz is indicated by the next boldest solid line, and he plot of the case where the frequency is 50 MHz is indicated by the thin solid line.

In the graphs shown in FIG. 8A to FIG. 8D, the value $V_{AGC}$ on the X axis indicates, in volt unit, the ½ value of the voltage at the $v_{agc}$+ terminal 9 in the structure of FIG. 5, with respect to the electric potential of the $v_{agc}$− terminal 10 as a reference. Also in the structure of FIG. 5, as described above, the bases of the output-side transistors 4a and 4b are connected to the $v_{agc}$+ terminal 9, and the bases of the non-output-side transistors 5a and 5b are connected to the $v_{agc}$− terminal 10. The gain fluctuations arising in accordance with the changes of the value $V_{AGC}$ are expressed by the changes of the value $S_{21}$ shown in FIG. 8C. Also in the Example 3, the simulations on the value of IIP3 were conducted under a setting that two tone signals having frequencies which were distanced from each other by 20 kHz were input at an intensity of −50 dBm.

With reference to FIG. 8A to FIG. 8D, it is known that any of the values NF, $S_{11}$, $S_{21}$, and IIP3 in the structure of FIG. 5 takes almost the same values as those taken in the structure of FIG. 4. However, in case of the structure of FIG.5, it is known that the capacitance of the capacitors used in its negative feedback paths can be made smaller, reducing the die size it occupies, than that used in the structure of FIG.4 to meet the same specification generally.

Accordingly, also with the structure of FIG. 5, which acquires bias currents for the emitter follower circuits from a power source different from the source of supplying currents flowing in the loads, it is possible to secure a gain variable range of about 60 dB, and to secure the advantages described in the explanation of the first or the second embodiment.

As described above, according to the present invention, it is possible to achieve a variable gain amplifier and a differential amplifier having an almost constant input reflection characteristic regardless of the gain, a fine input matching characteristic over a wide band regardless of the gain, and an almost constant distortion characteristic. Further, according to the present invention, it is possible to achieve a variable gain amplifier and a differential amplifier which are less suffered from the Miller effect, thereby improving high frequency characteristics, can secure a gain variable range of about 60 dB, and have a fine input matching characteristic and a fine noise figure characteristic over a wide band.

Various embodiments and changes may be made thereto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-192307 filed on Jun. 30, 2005 and including specification, claims, drawings and summary. The disclosure of the above Japanese Patent Application is incorporated herein by reference in its entirety.

What is claimed is:

1. A variable gain amplifier, comprising:
an amplifying element for signal amplification, having a first current path and a first control terminal;
an amplifying element for gain control at an output side, having a second current path connected to a load at an output side, and a second control terminal;
an amplifying element for gain control at a non-output side, having a third current path connected to a load at a non-output side, and a third control terminal; and
first and second negative feedback paths,
so that an electric current, which corresponds to an input signal input to said first control terminal and amplified by a gain determined by control signals input to said second and third control terminals, will flow to said load at the output side via said second current path,
wherein:
said amplifying element for signal amplification, said amplifying element for gain control at the output side, and said amplifying element for gain control at the non-output side are connected to one another such that a current flowing in said first current path will dividedly flow to said second and third current paths;
said first negative feedback path connects said second current path to said first control terminal, in order to return a feedback signal according to an amount of a current flowing in said load at the output side to said first control terminal; and
said second negative feedback path connects said third current path to said first control terminal, in order to return a feedback signal according to an amount of a current flowing in said load at the non-output side to said first control terminal.

2. The variable gain amplifier according to claim 1, wherein:
an impedance of said load at the output side and an impedance of said load at the non-output side are substantially equal to each other, and
a circuit constant of said first negative feedback path and a circuit constant of said second negative feedback path are substantially equal to each other.

3. The variable gain amplifier according to claim 1, wherein said first and second negative feedback paths each comprises a buffer circuit for receiving and buffering the feedback signal, and outputting it to said first control terminal.

4. The variable gain amplifier according to claim 3, wherein a supply source for a power to drive each of said buffer circuits is different from a supply source for the current flowing in each of said loads.

5. The variable gain amplifier according to claim 1, wherein said amplifying element for signal amplification, for gain control at the output side, or for gain control at the non-output side comprises a bipolar transistor, said control terminal of said amplifying element comprises a base of said bipolar transistor, and one end and the other end of said current path of said amplifying element comprise an emitter and a collector of said bipolar transistor.

6. The variable gain amplifier according to claim 1, wherein said amplifying element for signal amplification, for gain control at the output side, or for gain control at the non-output side comprises a field effect transistor, said control terminal of said amplifying element comprises a gate of said field effect transistor, and one end and the other end of said current path of said amplifying element comprise a source and a drain of said field effect transistor.

7. A differential amplifier comprising first and second variable gain amplifiers,
wherein each of said first and second variable gain amplifiers comprises an amplifying element for signal amplification having a first current path and a first control terminal, an amplifying element for gain control at an output side having a second current path connected to a load at an output side and a second control terminal, an amplifying element for gain control at a non-output side having a third current path connected to a load at a non-output side and a third control terminal, and first and second negative feedback paths, so that an electric current, which corresponds to an input signal input to said first control terminal and amplified by a gain determined by control signals input to said second and third control terminals, will flow to said load at the output side via said second current path, wherein said amplifying element for signal amplification, said amplifying element for gain control at the output side, said amplifying element for gain control at the non-output side are connected to one another such that a current flowing in said first current path will dividedly flow to said second and third current paths, said first negative feedback path connects said second current path to said first control terminal, in order to return a feedback signal following an amount of a current flowing in said load at the output side to said first control terminal, and said second negative feedback path connects said third current path to said first control terminal, in order to return a feedback signal following an amount of a current flowing in said load at the non-output side to said first control terminal,
wherein said differential amplifier causes electric currents, which correspond to input signals input to said first control terminals of said first and second variable gain amplifiers and amplified by gains determined by control signals input to said second and third control terminals of said first and second variable gain amplifiers, to flow to said respective loads at the output side via said second current paths of said first and second variable gain amplifiers.

8. The differential amplifier according to claim 7, wherein:
an impedance of said load at the output side and an impedance of said load at the non-output side are substantially equal to each other, and
a circuit constant of said first negative feedback path and a circuit constant of said second negative feedback path are substantially equal to each other.

9. The differential amplifier according to claim 7, wherein said first and second negative feedback paths each comprises a buffer circuit for receiving and buffering the feedback signal, and outputting it to said first control terminal.

10. The differential amplifier according to claim 9, wherein a supply source for a power to drive each of said buffer circuits is different from a supply source for the current flowing in each of said loads.

11. The differential amplifier according to claim 7, wherein said amplifying element for signal amplification, for gain control at the output side, or for gain control at the non-output side comprises a bipolar transistor, said control terminal of said amplifying element comprises a base of said bipolar transistor, and one end and the other end of said current path of said amplifying element comprise an emitter and a collector of said bipolar transistor.

12. The differential amplifier according to claim 7, wherein said amplifying element for signal amplification, for gain control at the output side, or for gain control at the non-output side comprises a field effect transistor, said control terminal of said amplifying element comprises a gate of said field effect transistor, and one end and the other end of said current path of said amplifying element comprise a source and a drain of said field effect transistor.

* * * * *